US008539302B2

(12) United States Patent
Kamoshida

(10) Patent No.: US 8,539,302 B2
(45) Date of Patent: Sep. 17, 2013

(54) ERROR DETECTING/CORRECTING CODE GENERATING CIRCUIT AND METHOD OF CONTROLLING THE SAME

(75) Inventor: Shiro Kamoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 532 days.

(21) Appl. No.: 12/948,816

(22) Filed: Nov. 18, 2010

(65) Prior Publication Data

US 2011/0119559 A1 May 19, 2011

(30) Foreign Application Priority Data

Nov. 18, 2009 (JP) ................................. 2009-263229

(51) Int. Cl.
*H03M 13/00* (2006.01)
(52) U.S. Cl.
USPC ......................................................... 714/758
(58) Field of Classification Search
None
See application file for complete search history.

(56) References Cited

U.S. PATENT DOCUMENTS

| 3,648,239 | A |   | 3/1972  | Carter et al.   |         |
|-----------|---|---|---------|-----------------|---------|
| 4,241,446 | A |   | 12/1980 | Trubisky        |         |
| 4,345,328 | A |   | 8/1982  | White           |         |
| 5,313,475 | A |   | 5/1994  | Cromer et al.   |         |
| 5,617,432 | A | * | 4/1997  | Eggenberger et al. | 714/752 |
| 5,942,002 | A | * | 8/1999  | Brandin         | 714/757 |
| 7,523,380 | B1| * | 4/2009  | Trimberger      | 714/763 |
| 8,301,972 | B2| * | 10/2012 | Tang            | 714/758 |
| 8,386,897 | B1| * | 2/2013  | Northcott       | 714/786 |
| 2004/0230885 | A1 | * | 11/2004 | Newcombe et al. | 714/758 |
| 2010/0306612 | A1 | * | 12/2010 | Tang            | 714/752 |
| 2011/0099451 | A1 | * | 4/2011  | Wezelenburg et al. | 714/755 |

FOREIGN PATENT DOCUMENTS

| JP | 48-066334 A | 9/1973  |
|----|-------------|---------|
| JP | 06-324951 A | 11/1994 |

OTHER PUBLICATIONS

"Extended European Search Report", mailed by EPO and corresponding to European application No. 10189814.6 on Dec. 4, 2012.

* cited by examiner

*Primary Examiner* — Gabriel Chu
(74) *Attorney, Agent, or Firm* — Fujitsu Patent Center

(57) ABSTRACT

An error detecting/correcting code generating circuit includes a first exclusive OR operation circuit that generates $\log_2(n+1)$ bits of one portion of a redundant portion of error detecting/correcting-code-attached data by rounding up the numbers to the right of the decimal point of $\log_2(n+1)$ in response to the input of m bytes of an information portion included in error-detection-bit-attached data. The error-detection-bit-attached data includes a redundant portion of m bits of error detection bits allocated to the m bytes of the information portion, the byte having n bits. The circuit also includes a second exclusive OR operation circuit that generates m bits of another portion of the redundant portion of the error detecting/correcting-code-attached data in response to the input of the one portion and the error detection bits.

9 Claims, 12 Drawing Sheets

ERROR DETECTING/CORRECTING CODE GENERATING CIRCUIT AND METHOD OF CONTROLLING THE SAME

CROSS-REFERENCE TO RELATED APPLICATIONS

This application is based upon and claims the benefit of priority of Japanese Patent Application 2009-263229, filed on Nov. 18, 2009, the entire contents of which are incorporated herein by reference.

BACKGROUND

1. Field of the Invention

The present invention relates to an error detecting/correcting code generating circuit and a method of controlling the error detecting/correcting code generating circuit.

2. Description of the Related Art

Japanese Laid-Open Patent Publication No. 6-324951 (corresponding to U.S. Pat. No. 5,313,475) discusses an error correcting code function and a parity interface scheme providing a translation capability between the error correcting code and parity protocols that are implemented for memory systems in personal computers.

Japanese Laid-Open Patent Publication No. 48-66334 discusses a parity check circuit for a data transfer system in which information is exchanged between a data processing unit and a memory unit having an ECC (Error Checking and Correction) code. The parity check circuit includes a code converting unit that performs code conversion between the ECC code and the parity check bit. It is discussed that the parity check bit can be directly calculated by an operating unit.

SUMMARY

In one aspect, the invention may provide an error detecting/correcting code generating circuit including a first Exclusive-OR operation circuit that generates $\log_2(n+1)$ bits of one portion of a redundant portion of error detecting/correcting-code-attached data by rounding up the numbers to the right of the decimal point of $\log_2(n+1)$ in response to the input of m bytes of an information portion included in error-detection-bit-attached data. The error-detection-bit-attached data includes a redundant portion of m bits of error detection bits allocated to the m bytes of the information portion, the byte having n bits. The circuit also includes a second Exclusive-OR operation circuit that generates m bits of another portion of the redundant portion of the error detecting/correcting-code-attached data in response to the input of the one portion and the error detection bits.

In another aspect, the invention may provide a method of controlling an error detecting/correcting code generating circuit, the method including generating one portion of $\log_2(n+1)$ bits of a redundant portion of error detecting/correcting-code-attached data by rounding up the numbers to the right of the decimal point of $\log_2(n+1)$ in response to the input of m bytes of an information portion included in error-detection-bit-attached data, using a first Exclusive-OR operation circuit of the error detecting/correcting code generating circuit. The error-detection-bit-attached data includes a redundant portion of m bits of error detection bits allocated to the m bytes of the information portion, each byte having n bits.

The method also includes generating another portion of m bits of the redundant portion of the error detecting-code-attached data in response to the input of the $\log_2(n+1)$ bits of the one portion and the error detection bits, using a second Exclusive-OR operation circuit of the error detecting/correcting code generating circuit.

In another aspect, the invention may provide a data operating unit including a memory in which error detecting/correcting-code-attached data including an information portion of m bytes and a redundant portion is written, each byte having n bits; and an error detecting/correcting code generating circuit including a first Exclusive-OR operation circuit and a second Exclusive-OR operation circuit. The first Exclusive-OR operation circuit generates one portion of $\log_2(n+1)$ bits of the redundant portion of the error detecting/correcting-code-attached data by rounding up the numbers to the right of the decimal point of $\log_2(n+1)$, in response to the input of the m bytes of the information portion included in error-detection-bit-attached data. The error-detection-bit-attached data includes a redundant portion of m bits of error detection bits allocated to the m bytes of the information portion.

The second Exclusive-OR operation circuit generates another portion of m bits of the redundant portion of the error detecting/correcting-code-attached data in response to the input of the one portion and the error detection bits. The unit also includes an error detecting/correcting circuit that detects or corrects an error in the information portion in response to the input of the redundant portion of the error detecting/correcting-code-attached data read from the memory; an error-detection-bit-attached data generating circuit that generates the error-detection-bit-attached data having the m bytes of the information portion of the error detecting/correcting-code-attached data read from the memory and the redundant portion having the m bits of the error detection bits allocated to the m bytes of the information portion; and an operating unit that performs an operating process on the error-detection-bit-attached data.

In another aspect, the invention may provide a data operating unit including a memory in which error detecting/correcting-code-attached data of $(n+1)m+[\log_2(n+1)]$ bits including an information portion of mn bits and a redundant portion are written. The redundant portion includes one portion of $[\log_2(n+1)]$ bits and another portion of m bits, $[\log_2(n+1)]$ indicating $\log_2(n+1)$ from which the numbers to the right of the decimal point have been rounded up. The unit also includes an error-detection-bit-attached data generating circuit that generates each bit of a redundant portion of error-detection-bit-attached data by using a maximum of $[\log_2(n+1)]$ bits of the redundant portion of the error detecting/correcting-code-attached data read from the memory. The error detecting/correcting-code-attached data includes the information portion. The redundant portion of the error detecting/correcting-code-attached data includes error detection bits of which one bit is allocated to every n bits of the information portion. The unit also includes an error detecting/correcting circuit that detects or corrects an error in the information portion in response to the input of the redundant portion of the error detecting/correcting-code-attached data read from the memory; and an operating unit that performs an operating process on the error-detection-bit-attached data.

The object and advantages of the disclosure will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

A complete understanding of the present invention may be obtained by reference to the accompanying drawings, when considered in conjunction with the subsequent detailed description, in which.

DESCRIPTION OF EMBODIMENTS

Figure 1:
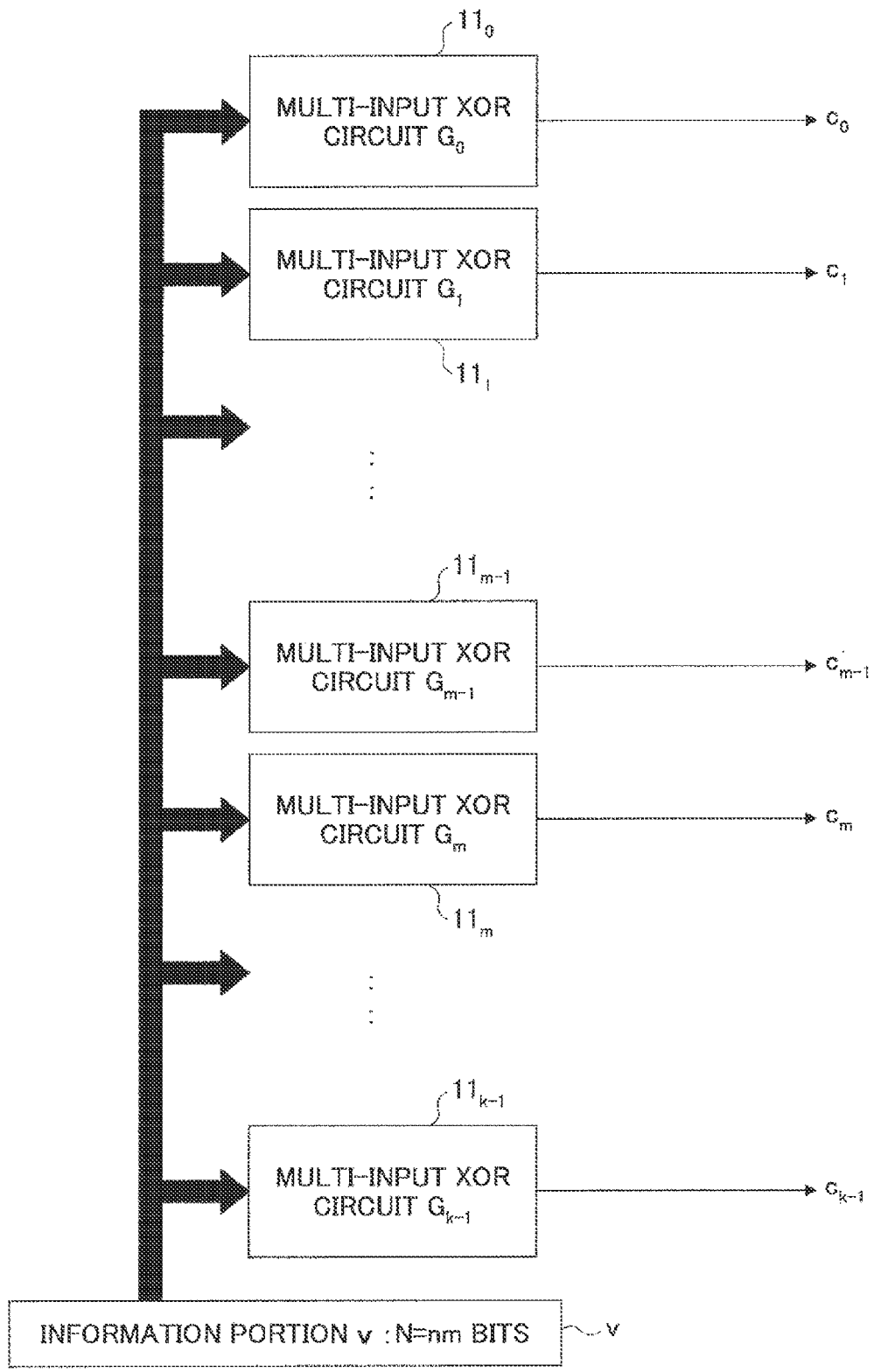
FIG. 1 illustrates a circuit for generating a redundant portion of the SECDED code according to a related technology.

An Exclusive-OR (hereafter "XOR") circuit tree may generate a parity bit and an ECC (Error Checking and Correction) checking bit in response to the input of data. The XOR circuit tree may have data inputs A through P of which data inputs A through H are involved in the generation of the ECC checking bit and the parity bit, while data inputs I through P are only involved in the generation of the ECC checking bit. The parity bit in whose generation data inputs A through H are involved and the ECC checking bit in whose generation data inputs I through P are involved may be involved in the generation of an ECC checking bit for data inputs A through P.

A code conversion method may involve calculating a parity bit based on a data bit and an error correcting code attached to the data bit.

Outline of Embodiments

1) In accordance with a first embodiment of the present invention, data includes n bits of information and one bit of an error detection bit (i.e., parity bit) for the n bits of the information. The sum of the n bits of the information and the one bit of the parity bit, i.e., (n+1), constitutes one unit of data, or "byte". Data α includes m bytes (i.e., (n+1)m bits). In other words, data α includes nm bits of an information portion and m bits of a redundant portion (parity bits). The "redundant portion" refers to information used for detecting an error in the information portion or for correcting the detected error. In the first embodiment, a SECDED (Single bit Error Correct and Double bit Error Detect) code β is generated from the information portion of nm bits of data α, the redundant portion of m bits, and another redundant portion of $[\log_2(n+1)]$ bits which will be described later. [X] indicates a natural number that satisfies $X \leq [X] < X+1$; Namely, a number obtained by rounding up the numbers to the right of the decimal point of X.

Thus, $[\log_2(n+1)]$ is a natural number such that $\log_2(n+1) \leq [\log_2(n+1)] < \log_2(n+1)+1$, i.e., a number obtained by rounding up the numbers to the right of the decimal point of $\log_2(n+1)$. Thus, the SECDED code β includes the nm bits of the information portion and the m bits of the redundant portion of data α, and the $[\log_2(n+1)]$ bits of the other redundant portion, for a total of $(n+1)m+[\log_2(n+1)]$ bits.

2) In accordance with a second embodiment of the present invention, in the method according to the first embodiment 1), the $[\log_2(n+1)]$ bits of the redundant portion (which is hereafter referred to as "β") of the SECDED code β is generated based on the nm bits of the information portion of data α. The remaining m bits of the redundant portion of β are only generated from the parity bits of data α and β*.

3) In accordance with a third embodiment of the present invention, data α is generated from the SECDED code β $((n+1)m+[\log_2(n+1)]$ bits).

4) In accordance with a fourth embodiment of the present invention, in the method according to the third embodiment 3), an arbitrary one of the parity bits of data α is generated from some (such as $[\log_2(n+1)]$ bits or less) of all the bits of the SECDED code β $((n+1)m+[\log_2(n+1)]$ bits).

5) In accordance with a fifth embodiment of the present invention, the method according to the second embodiment 2) and the method according to the fourth embodiment 4) are simultaneously carried out.

In the following, the background of the various embodiments of the present invention is described. An electronic circuit may include an error detecting/correcting circuit, such as a RAS (Reliability, Availability and Serviceability) circuit. The RAS circuit may be used for detecting a built-in defect introduced during a manufacturing process, or detecting and correcting a data error caused by voltage variation or α rays or neutron rays and the like during the use of the product. In order to detect and correct such an error, it is necessary to introduce redundancy in the data as the subject of error detection or correction, in addition to providing the RAS circuit as a hardware component. The size of a redundant portion of the data may vary depending on the purpose of the error detection or correction.

For example, a method may involve allocating one bit of a parity bit for every 8 bits of information (data), the parity bit being logically equal to a value obtained by an XOR operation of the information 8 bits, and providing a circuit for calculating an XOR operation of the 8 bits of information and the parity bit in order to detect a single-bit error. In this method, if the number of bits of all the information is 32, 32÷8=4 bits of parity bits would be required, so that there would be a total of 36 bits of data. This method is often used in cases where the frequency of error in the information is not so high and there is no tendency of multiple bits of error occurring in adjacent bits of the information, and when the RAS circuit cannot be provided with sufficient resources or execution latency. For example, the method may be used within an operating unit of a processor. Hereafter, the data in which a parity bit (redundant portion) is attached to information (information portion) so that a single-bit error in the information can be detected as described above is referred to as a "byte parity code".

When data needs to be repaired, such as when handling data read from a random access memory (RAM), a RAS circuit capable of not just detection but correction of an error is often employed. For example, by adding 7 bits of redundant bits to 32 bits of data (for a total of 39 bits), an error correcting code (ECC) capable of single-bit error correction and double-bit error detection can be generated. The "single-bit error correction" and "double-bit error detection" may be referred to as "SECDED (Single bit Error Correct and Double bit Error Detect)". Thus, a "SECDED code" means a code capable of single-bit error correction and double-bit error detection. A RAS circuit capable of such an error correction requires a relatively large amount of resources, and it also needs much time (latency) for error detection and correction. The SECDED code may include an "extended Hamming code" which is a Hamming code capable of single-bit error correction to which one bit generated from an XOR operation of the entire data is added. In the following, the data including information (information portion) to which an ECC (redundant portion) is added and which is capable of double-bit error determination and a single-bit error correction in the information is referred to as the "SECDED code".

Thus, the RAS circuit may be variously configured to suit the particular purpose, so that the data having the same information content may have different forms depending on the type of the RAS circuit. For example, transmission of data from RAM to an operating unit may involve conversion from the SECDED code to the byte parity code. Conversely, transmission of data from the operating unit to RAM may involve conversion of the data from the byte parity code to the SECDED code.

Hereafter, a technology relevant to the embodiments of the present invention ("relevant technology") is described. The relevant technology may directly generate the redundant portion of the byte parity code or the SECDED code by utilizing the information portion. For example, the redundant portion of the byte parity code may be generated by an XOR operation of 8 bits of the information portion, or the redundant portion of 32 bits of data of a SECDED code may be generated by an XOR operation of some of the 32 bits of the information portion. Even in a case where data is exchanged between circuits that handle different codes, the relevant technology rarely generates a code by utilizing the code of the other party. Naturally, there is not much incentive to mutually utilize the two different types of codes with each other. This may be explained by the difficulty in finding relevance between the redundant portions of the two types of codes, such as between the byte parity code and the SECDED code, for example.

If the redundant portions of different codes can be mutually utilized for generating each other's codes, the amount of circuitry necessary for generating codes may be reduced and also execution latency may be reduced. In accordance with the various embodiments of the present invention, the number of circuits necessary for code generation and execution latency are reduced by mutually utilizing the redundant portions of the byte parity code and the SECDED code when mutual conversion is performed between them.

In an embodiment of the present invention, the SECDED code is generated in such a manner that enables the relevance between the redundant portions of the byte parity code and the SECDED code to be readily found in order to facilitate mutual utilization. In the relevant technology, the SECDED code is an extended Hamming code as mentioned above which is generated by adding the redundant portion $k=[\log_2(N+1)]+1$ bits to N bits of the information portion. However, when $k<(\log_2(N+k+1))+1$, the redundant portion is $k+1$ bits. In contrast, in accordance with the present embodiment, the SECDED code is generated by adding the redundant portion $k=([\log_2(n+1)]+m)$ bits to the information portion N=nm bits.

For example, when n=8, m=4, and N=nm=32, the redundant portion of the SECDED code is $k=([\log_2 33]+1)=6+1=7$ bits according to the relevant technology. On the other hand, the redundant portion of the SECDED code according to the embodiment is $k=[\log_2 9]+4=4+4=8$ bits. By using the SECDED code according to the present embodiment, it is possible to generate, from the redundant portion of the SECDED code, a parity bit (i.e., the redundant portion of the byte parity code) of which one bit is added to n bits of information. Conversely, it is also possible to generate the redundant portion of the SECDED code by utilizing the parity bit (i.e., the redundant portion of the byte parity code) of which one bit is added to n bits of information. By using the SECDED code according to the present embodiment, the number of gates in the RAS circuit can be reduced, the speed of the RAS circuit can be increased (i.e., delay can be reduced), and the ease and coverage of logic inspection of the RAS circuit can be enhanced.

A method of making a SECDED code according to an embodiment is described. N bits of the information portion of the SECDED code include m blocks (bytes), each byte having n bits. Thus, N=nm. As will be described later, data (byte parity code) capable of single-bit error detection in 1 byte is generated by adding a single parity bit to the 1 byte (n bits). Initially, as a preparation for making the SECDED code from the nm bits of the information portion, a check matrix H is defined according to the following expressions 1 through 6. In the following description, all of the matrix and vector spaces used in the following description are defined in a field $F_2=\{0, 1\}$. By substituting $d=[\log_2(n+1)]$, the number of bits k of the redundant portion of the SECDED code can be written $k=d+m$.

The check matrix H is defined as follows:

$$H\begin{pmatrix} A_{(0)} & A_{(1)} & A_{(2)} & \cdots & A_{(m-2)} & A_{(m-1)} & I_m & C \\ B & B & B & \cdots & B & B & O & I_d \end{pmatrix} \quad \text{Expression 1}$$

$$O = \begin{pmatrix} 000 & \cdots & 00 \\ 000 & \cdots & 00 \\ \vdots & & \\ 000 & \cdots & 00 \\ 000 & \cdots & 00 \end{pmatrix} \Bigg\} d \text{ bit} = d \times n \text{ zero matrix} \quad \text{Expression 2}$$

$$\underbrace{\phantom{000 \cdots 00}}_{n \text{ bit}}$$

$$I_i = \begin{pmatrix} 100 & \cdots & 00 \\ 010 & \cdots & 00 \\ \vdots & & \\ 000 & \cdots & 10 \\ 000 & \cdots & 01 \end{pmatrix} \Bigg\} i \text{ bit} = i \times i \text{ unit matrix} \quad \text{Expression 3}$$

$$\underbrace{\phantom{000 \cdots 00}}_{i \text{ bit}}$$

$$A_{(i)} = \underbrace{(e_{(i)} \; e_{(i)} \; e_{(i)} \; \cdots \; e_{(i)} \; e_{(i)})}_{n \text{ bit}} \quad \text{Expression 4}$$

$$= \begin{array}{c} \\ i\text{-th} \\ \text{component} \end{array} \rightarrow \begin{pmatrix} 000 & \cdots & 00 \\ 000 & \cdots & 00 \\ \vdots & & \\ 111 & \cdots & 11 \\ \vdots & & \\ 000 & \cdots & 00 \end{pmatrix} \Bigg\} m \text{ bit,}$$

$$\underbrace{\phantom{000 \cdots 00}}_{n \text{ bit}}$$

$$e_{(i)} = \begin{array}{c} \\ i\text{-th} \\ \text{component} \end{array} \rightarrow \begin{pmatrix} 0 \\ 0 \\ \vdots \\ 1 \\ \vdots \\ 0 \end{pmatrix} \Bigg\} m \text{ bit}$$

-continued $$B = (\underbrace{\underbrace{b_{(0)} \quad b_{(1)} \quad b_{(2)} \quad \ldots \quad b_{(n-2)} \quad b_{(n-1)}}_{n \text{ bit}})}_{} \} d \text{ bit} \quad \text{Expression 5}$$

"B" according to expression 5 indicates the d-order column vector where (i≠j) for given 0≦i, j≦n, and $b_{(i)}$ and $b_{(j)}$ (i≠j) are mutually linearly independent.

$$C = (\underbrace{c_{(0)} \quad c_{(1)} \quad c_{(2)} \quad \ldots \quad c_{(d-2)} \quad c_{(d-1)}}_{d \text{ bit}}) \} m \text{ bit} \quad \text{Expression 6}$$

"C" according to expression (6) indicates an m-order column vector where (i≠j) for given 0≦i, j≦n and $c_{(i)}$ and $c_{(j)}$ (i≠j) are mutually linearly independent. The number of times that "1" appears in each column vector $c_{(i)}$ of the matrix C is an odd number. When there is a column vector $c_{(i)}$ in the matrix C in which the number of times that "1" appears is one, there must not be a column vector in the matrix B (expression (5)) such that only the i-th component from top is "1" and the other components are "0". When there are a plurality of column vectors $c_{(i)}, \ldots, c_{(j)}$ in the column vector C in which the number of times that "1" appears is only one, there must not be a column vector in the matrix B such that only the i-th component from top is "1" and the other components are "0", or a column vector such that only the j-th component from top is "1" and the other components are "0".

The matrixes B and C may be made by more than one way. As will be described later, a generating matrix for generating the SECDED code may be made based on the check matrix H. When three column vectors are arbitrarily selected from the check matrix H, those three column vectors are mutually linearly independent, as will be described later. This is a condition for the check matrix H to be a check matrix for the SECDED code.

Examples of the check matrix H are illustrated below. For example, when n=8 and m=4, N=nm=32, so that d=[$\log_2 9$]=4. The following are examples of the elements of the check matrix H according to expression 1:

$$A_{(0)} = \begin{pmatrix} 11111111 \\ 00000000 \\ 00000000 \\ 00000000 \end{pmatrix} \quad A_{(1)} = \begin{pmatrix} 00000000 \\ 11111111 \\ 00000000 \\ 00000000 \end{pmatrix} \quad \text{Expression 7}$$

$$A_{(2)} = \begin{pmatrix} 00000000 \\ 00000000 \\ 11111111 \\ 00000000 \end{pmatrix} \quad A_{(3)} = \begin{pmatrix} 00000000 \\ 00000000 \\ 00000000 \\ 11111111 \end{pmatrix}$$

$$B = \begin{pmatrix} 10001001 \\ 01001100 \\ 00100110 \\ 00010011 \end{pmatrix} \quad C = \begin{pmatrix} 0111 \\ 1011 \\ 1101 \\ 1110 \end{pmatrix} \quad O = \begin{pmatrix} 0000 \\ 0000 \\ 0000 \\ 0000 \end{pmatrix}$$

$$I_4 = \begin{pmatrix} 1000 \\ 0100 \\ 0010 \\ 0001 \end{pmatrix}$$

In the above case, the check matrix H has the following values:

Expression 8

$$H = \begin{pmatrix} A_{(0)} & A_{(1)} & A_{(2)} & A_{(3)} & I_4 & C \\ B & B & B & B & O & I_4 \end{pmatrix} \quad (1)$$

$$= \begin{pmatrix} 11111111 & 00000000 & 00000000 & 00000000 & 1000 & 0111 \\ 00000000 & 11111111 & 00000000 & 00000000 & 0100 & 1011 \\ 00000000 & 00000000 & 11111111 & 00000000 & 0010 & 1101 \\ 00000000 & 00000000 & 00000000 & 11111111 & 0001 & 1110 \\ 10001001 & 10001001 & 10001001 & 10001001 & 0000 & 1000 \\ 01001100 & 01001100 & 01001100 & 01001100 & 0000 & 0100 \\ 00100110 & 00100110 & 00100110 & 00100110 & 0000 & 0010 \\ 00010011 & 00010011 & 00010011 & 00010011 & 0000 & 0001 \end{pmatrix}$$

When three column vectors are arbitrarily selected from the check matrix H according to expression 8, there is no combination such that the column vectors are identical. Thus, the three column vectors are mutually linearly independent. Therefore, the check matrix H satisfies the aforementioned condition for it to be a check matrix for the SECDED code.

The following is another example of the check matrix H:

Expression 9

$$A_{(0)} = \begin{pmatrix} 11111111 \\ 00000000 \\ 00000000 \\ 00000000 \end{pmatrix} \quad A_{(1)} = \begin{pmatrix} 00000000 \\ 11111111 \\ 00000000 \\ 00000000 \end{pmatrix} \quad A_{(2)} = \begin{pmatrix} 00000000 \\ 00000000 \\ 11111111 \\ 00000000 \end{pmatrix}$$

$$A_{(3)} = \begin{pmatrix} 00000000 \\ 00000000 \\ 00000000 \\ 11111111 \end{pmatrix} \quad B = \begin{pmatrix} 10011010 \\ 11000111 \\ 01101011 \\ 00110101 \end{pmatrix} \quad C = \begin{pmatrix} 1000 \\ 0100 \\ 0010 \\ 0001 \end{pmatrix}$$

$$O = \begin{pmatrix} 0000 \\ 0000 \\ 0000 \\ 0000 \end{pmatrix} \quad I_4 = \begin{pmatrix} 1000 \\ 0100 \\ 0010 \\ 0001 \end{pmatrix}$$

Expression 10

$$H = \begin{pmatrix} 11111111 & 00000000 & 00000000 & 00000000 & 1000 & 1000 \\ 00000000 & 11111111 & 00000000 & 00000000 & 0100 & 0100 \\ 00000000 & 00000000 & 11111111 & 00000000 & 0010 & 0010 \\ 00000000 & 00000000 & 00000000 & 11111111 & 0001 & 0001 \\ 10011010 & 10011010 & 10011010 & 10011010 & 0000 & 1000 \\ 11000111 & 11000111 & 11000111 & 11000111 & 0000 & 0100 \\ 01101011 & 01101011 & 01101011 & 01101011 & 0000 & 0010 \\ 00110101 & 00110101 & 00110101 & 00110101 & 0000 & 0001 \end{pmatrix} \quad (2)$$

When three column vectors are arbitrarily selected from the check matrix H of expression 10, there is no combination such that the three column vectors are identical. Thus, the three column vectors are mutually linearly independent, and therefore in this case too, the check matrix H satisfies the aforementioned condition for it to be a check matrix for the SECDED code. How the two check matrixes (1) and (2) are selected is described later.

Hereafter, a method of conversion of the redundant portions between the byte parity code and the SECDED code is described. A vector in a field $F_2$ in which N bits of the information portion are laterally arranged is considered. The information portion includes m bytes (each byte having n bits), as mentioned above. Thus, the vector v of the information portion may be expressed as follows:

$$v = \begin{pmatrix} \underline{v_{0(0)}, v_{0(1)}, \ldots, v_{0(n-2)}, v_{0(n-1)}} \\ \text{Byte } 0 \\ \underline{v_{1(0)}, \ldots, v_{1(n-1)}}, \cdots, \underline{v_{m-1(n-2)}, v_{m-1(n-1)}} \\ \text{Byte } 1 \qquad \cdots \qquad \text{Byte } m-1 \end{pmatrix} \quad \text{Expression 11}$$

where the component $v_i(j)$ of the information portion is either "0" or "1" (i.e., elements of the field $F_2 = \{0,1\}$).

The vector v is further divided at byte intervals so that the byte vector $v_i$ can be defined as follows:

Expression 12:

$$v = (v_0, v_1, \ldots, v_m), \text{ Each } v_i = v_{i(0)}, v_{i(1)}, \ldots, v_{i(n-2)}, v_{i(n-1)})$$

Based on the above, an element vp of the byte parity code and its redundant portion p, and an element vc of the SECDED code generated based on the check matrix H and its redundant portion c are defined as vectors in a field $F_2$ as follows:

Expression 13:

$$vp = (v, p_0, p_0, \ldots, p_{m-2}, p_{m-1}) = (v, p)$$

$$vc = (v, c_0, c_1, \ldots, c_{k-2}, c_{k-1}) = (v, c)$$

As needed, the redundant portion c of the SECDED code may be expressed by an m-order vector $c_1$ and a d-order vector $c_2$ as follows:

Expression 14:

$$c = (c_1, c_2)$$

By the definition of the parity, the respective components $p_i$ of the vector p of the redundant portion of vp satisfy the following relationship with the respective components of the vector v of the information portion:

Expression 15:

$$p_i = v_{i(0)} + v_{i(1)} + \ldots + v_{i(n-2)} + v_{i(n-1)}$$

where the operator "+" indicates an addition in the field $F_2$, i.e., an XOR operation. Similarly, the operator "+" and the term "sum" or "add" used with reference to operations among bits, matrixes, matrix elements, vectors, and vector elements refer to an XOR operation.

A necessary and sufficient condition for the vector vc as an element of the SECDED code to be a code based on the check matrix H by the definition of the code is expressed as follows:

Expression 16:

$$H \cdot vc^t = 0 \quad (3)$$

where the "t" at upper right of the vector indicates transposition (between a row vector and a column vector). The "0" in the right-hand side of equation (3) indicates a k-order zero column vector. Equation (3) holds when there is no inverted bit (=error) in the element vc of the SECDED code.

A case where the element vc of the SECDED code contains an error is described. In this case, the result of calculation of the left-hand side of equation (3) indicates a value other than "0". Specifically, in the case of a single-bit error, the calculation result of the left-hand side of equation (3), i.e., a column vector, coincides with one of the column vectors contained in the check matrix H. A bit in the information portion v included in the element vc of the SECDED code that corresponds to the position of the coinciding column vector in the check matrix H is the error bit. Thus, the error bit can be corrected.

In the case of a double-bit error, the column vector as a result of the calculation of the left-hand side of equation (3) is a value other than "0", as in the case of the single-bit error. However, in this case, the calculation result is a column vector of which the number of 1's included in the upper m bits is an even number (including zero). For example, as will be seen from the respective column vectors included in the check matrix H according to equations (1) and (2) of expressions 8 and 10, there is no column vector in the check matrix H in which the number of 1's included in the upper m bits is an even number. The "upper m bits" may refer to the upper four bits of each column vector included in the check matrix H according to equation (1) or (2). Thus, when a column vector having an even number (including zero) of 1's included in the upper m bits is calculated, it may be considered that an error of two (or more) bits has occurred. In this case, the error bit cannot be identified and only its detection can be made. Thus, by using the SECDED code generated based on the check matrix H according to the present embodiment of the present invention, a single-bit error of the information portion v of the SECDED code can be corrected and a double-bit error can be detected. Thus, the SECDED code according to the present embodiment can provide proper functions of the SECDED code.

The left-hand side member of equation (3), $H \cdot vc^t$, may be rewritten as follows by using the elements of the check matrix H:

$$H \cdot vc^t = \begin{pmatrix} A_{(0)} & A_{(1)} & \ldots & A_{(m-2)} & A_{(m-1)} & I_m & C \\ B & B & \ldots & B & B & O & I_d \end{pmatrix} \begin{pmatrix} v^t \\ c^t \end{pmatrix} \quad \text{Expression 17}$$

$$= \begin{pmatrix} A_{(0)} & A_{(1)} & \ldots & A_{(m-2)} & A_{(m-1)} \\ B & B & \ldots & B & B \end{pmatrix} \cdot v^t +$$

$$\begin{pmatrix} I_m & C \\ O & I_d \end{pmatrix} \cdot c^t$$

$$= \begin{pmatrix} A_{(0)} \\ B \end{pmatrix} \cdot v_0^t + \begin{pmatrix} A_{(1)} \\ B \end{pmatrix} \cdot v_1^t + \ldots + \begin{pmatrix} A_{(m-1)} \\ B \end{pmatrix} v_{m-1}^t +$$

$$\begin{pmatrix} I_m & O \\ O & I_d \end{pmatrix} \cdot c^t + \begin{pmatrix} O & C \\ O & O \end{pmatrix} \cdot c^t$$

where the respective terms of the lower-most equation can be rewritten as follows:

$$\begin{pmatrix} A_{(i-1)} \\ B \end{pmatrix} \cdot v_{i-1}^t = \begin{matrix} i-1\text{-th} \\ \text{component} \end{matrix} \to \begin{pmatrix} 000 \ldots 00 \\ 000 \ldots 00 \\ \vdots \\ 111 \ldots 11 \\ \vdots \\ 000 \ldots 00 \\ B \end{pmatrix} \cdot v_{i-1}^t \quad \text{Equation 18}$$

$$= \begin{matrix} i-1\text{-th} \\ \text{component} \end{matrix} \to \begin{pmatrix} 0 \\ 0 \\ \vdots \\ v_{i-1(0)} + v_{i-1(1)} + \ldots + v_{i-1(n-2)} + v_{i-1(n-1)} \\ \vdots \\ 0 \\ B \cdot v_{i-1}^t \end{pmatrix}$$

-continued $$= \begin{pmatrix} 0 \\ 0 \\ \vdots \\ p_{i-1} \\ \vdots \\ 0 \\ B \cdot v_{i-1}^t \end{pmatrix}$$

Thus, the respective terms of the lower-most equation of expression 17 can be rewritten as follows:

Expression 19

$$\begin{pmatrix} A_{(0)} \\ B \end{pmatrix} \cdot v_0^t + \begin{pmatrix} A_{(1)} \\ B \end{pmatrix} \cdot v_1^t + \ldots + \begin{pmatrix} A_{(m-1)} \\ B \end{pmatrix} \cdot v_{m-1}^t =$$

$$\begin{pmatrix} p_0 \\ p_1 \\ \vdots \\ p_{m-1} \\ B \cdot v_0^t + B \cdot v_1^t + \ldots + B \cdot v_{m-1}^t \end{pmatrix} =$$

$$\begin{pmatrix} p^t \\ B \cdot v_0^t + B \cdot v_1^t + \ldots + B \cdot v_{m-1}^t \end{pmatrix}$$

The other terms of the lower-most equation of expression 17 can be rewritten as follows:

$$\begin{pmatrix} I_m & O \\ O & I_d \end{pmatrix} \cdot c^t = c^t = \begin{pmatrix} c_1^t \\ c_2^t \end{pmatrix}, \begin{pmatrix} O & C \\ O & O \end{pmatrix} \cdot c^t = \begin{pmatrix} C \cdot c_2^t \\ 0^t \end{pmatrix} \quad \text{Expression 20}$$

Thus, the upper equation of expression 21 can be obtained from equation (3) of expression 16, and equation (4) of expression 21 can be obtained from the upper equation of expression 21.

Expression 21

$$H \cdot vc^t = \begin{pmatrix} p^t \\ B \cdot v_0^t + B \cdot v_1^t + \ldots + B \cdot v_{m-1}^t \end{pmatrix} + \begin{pmatrix} c_1^t \\ c_2^t \end{pmatrix} + \begin{pmatrix} C \cdot c_2^t \\ 0^t \end{pmatrix}$$

$$= \begin{pmatrix} 0 \\ 0 \end{pmatrix}$$

$$\Leftrightarrow$$

$$\begin{pmatrix} c_1^t \\ c_2^t \end{pmatrix} = \begin{pmatrix} p^t + C \cdot c_2^t \\ B \cdot v_0^t + B \cdot v_1^t + \ldots + B \cdot v_{m-1}^t \end{pmatrix} \quad (4)$$

In the above calculations, the property of the element $F_2$ that $-1=+1$ is utilized.

Equation (4) of expression 21 is a formula for obtaining the redundant portion of the SECDED code according to the present embodiment, where the redundant portion is determined by the shape of the column vector.

It can be seen from equation (4) that the lower d bits ($c_2^t$) of the column vector are generated from the sum of some of the components of the information portion v, and that the upper m bits (i.e., $c_1^t$) are generated by the sum of some of the components of the lower d bits ($c_2^t$) of the generated redundant portion and a single parity bit $p^t$. Particularly, the lower d bits are obtained by repeated addition of the column vectors of the shape $B \cdot v_{i-1}^t$ (i=1, ..., m). Thus, there may be provided a single conversion circuit using the matrix B for $v_{i-1}^t$, and a circuit may be realized that calculates $c_2^t$ by repeating the cycle of adding $B \cdot v_{i-1}^t$ obtained by the conversion circuit while updating i. In this way, the size of the circuit for generating $c_2^t$ may be reduced to approximately 1/m of the normal size. On the other hand, when latency is given more importance, a circuit that directly obtains the polynomial $B \cdot v_0^t + B \cdot v_1^t + \ldots + B \cdot v_{m-1}^t$ included in equation (4) may be provided. Further, the above two types of circuits may be combined into a hybrid circuit.

Regarding the upper m bits of equation (4), the following equation is obtained:

Expression 22:

$$p^t = c_1^t + C \cdot c_2^t \quad (5)$$

Equation (5) of expression 22 is a formula for determining the redundant portion of the byte parity code according to the present embodiment. According to equation (5), the parity bit can be generated only from the redundant portions $c_1$ and $c_2$ of the SECDED code.

Focusing on one of the components of the column vectors in the right-hand side of equation (5), the number of terms required for calculating the right-hand side of equation (5) is considered. It can be seen that within the right-hand side, the maximum number of terms that appear in the first term $c_1^t$ is one, and the maximum number of terms that appear in the next term $C \cdot c_2^t$ is d. Thus, the number of terms required for generating the parity bit according to the present embodiment is equal to or less than $d+1=[\log_2(n+1)]+1$.

For example, in the case of n=8, eight terms are required for generating the parity bit from expression 15 according to the relevant technology. According to the present embodiment, $d+1=[\log_2(8+1)]+1=[\log_2 9]+1=5$, so that the parity bit can be generated by using a maximum of five terms. Similarly, in the case of n=16, the relevant technology requires 16 terms, whereas the present embodiment requires a maximum of $[\log_2(16+1)]+1=6$ terms.

From equation (5), it can also be seen that the number of terms that are added during the generation of the parity bit according to the present embodiment is determined by the matrix C. Therefore, in order to minimize the number of terms added, the matrix C may be selected such that "1" appears only once in the components of each column vector. Namely, in the case of a square matrix C, the matrix C only needs to be a permutation matrix (including a unit matrix). An example is the matrix C of expression 9 used in the check matrix H (2) of expressions 9 and 10. The number of terms required in this case is two (see equation (2-2) of expression 31 as will be described later). Thus, all of the parity bits can be generated by simply calculating the sum of one each of the components $c_1^t$ and $c_2^t$ (i.e., XOR operation). This example is very effective when data stored in memory in the SECDED code format is read by converting the data into byte-parity-code format data. In this case, the circuit for such data conversion requires only one 2-input XOR circuit for each bit of the parity bits (see FIG. 10 which will be described later).

Next, an example where n=8 and m=4 is described. In the example, the check matrix H according to equation (8) is used, and the various signs are defined as follows:

Expression 23

$$v = (v_{0(0)}, v_{0(1)}, \ldots, v_{0(7)}, v_{1(0)}, \ldots, v_{3(6)}, v_{3(7)}) = (v_0, v_1, v_2, v_3)$$

$$p = (p_0, p_1, p_2, p_3)$$

$$c = (c_0, c_1, c_2, c_3, c_4, c_5, c_6, c_7),$$

-continued $$c_1 = (c_0, c_1, c_2, c_3),$$

$$c_2 = (c_4, c_5, c_6, c_7)$$

$$B = \begin{pmatrix} 10001001 \\ 01001100 \\ 00100110 \\ 00010011 \end{pmatrix} \quad C = \begin{pmatrix} 0111 \\ 1011 \\ 1101 \\ 1110 \end{pmatrix}$$

Substituting the above into equation (4) used for generating the SECDED code yields the redundant portion $c_0, \ldots, c_7$ of the SECDED code as shown below:

Expression 24

$$\begin{pmatrix} c_0 \\ c_1 \\ c_2 \\ c_3 \\ c_4 \\ c_5 \\ c_6 \\ c_7 \end{pmatrix} = \begin{pmatrix} \begin{pmatrix} p_0 \\ p_1 \\ p_2 \\ p_3 \end{pmatrix} + \begin{pmatrix} 0111 \\ 1011 \\ 1101 \\ 1110 \end{pmatrix} \begin{pmatrix} c_4 \\ c_5 \\ c_6 \\ c_7 \end{pmatrix} \\ \begin{pmatrix} 10001001 \\ 01001100 \\ 00100110 \\ 00010011 \end{pmatrix} \begin{pmatrix} v_{0(0)} \\ v_{0(1)} \\ v_{0(2)} \\ v_{0(3)} \\ v_{0(4)} \\ v_{0(5)} \\ v_{0(6)} \\ v_{0(7)} \end{pmatrix} + \begin{pmatrix} 10001001 \\ 01001100 \\ 00100110 \\ 00010011 \end{pmatrix} \begin{pmatrix} v_{1(0)} \\ v_{1(1)} \\ v_{1(2)} \\ v_{1(3)} \\ v_{1(4)} \\ v_{1(5)} \\ v_{1(6)} \\ v_{1(7)} \end{pmatrix} + \\ \begin{pmatrix} 10001001 \\ 01001100 \\ 00100110 \\ 00010011 \end{pmatrix} \begin{pmatrix} v_{2(0)} \\ v_{2(1)} \\ v_{2(2)} \\ v_{2(3)} \\ v_{2(4)} \\ v_{2(5)} \\ v_{2(6)} \\ v_{2(7)} \end{pmatrix} + \begin{pmatrix} 10001001 \\ 01001100 \\ 00100110 \\ 00010011 \end{pmatrix} \begin{pmatrix} v_{3(0)} \\ v_{3(1)} \\ v_{3(2)} \\ v_{3(3)} \\ v_{3(4)} \\ v_{3(5)} \\ v_{3(6)} \\ v_{3(7)} \end{pmatrix} \end{pmatrix}$$

$$= \begin{pmatrix} p_0 + c_5 + c_6 + c_7 \\ p_1 + c_4 + c_6 + c_7 \\ p_2 + c_4 + c_5 + c_7 \\ p_3 + c_4 + c_5 + c_6 \\ \\ v_{0(0)} + v_{0(4)} + v_{0(7)} + v_{1(0)} + v_{1(4)} + v_{1(7)} + \\ v_{2(0)} + v_{2(4)} + v_{2(7)} + v_{3(0)} + v_{3(4)} + v_{3(7)} \\ v_{0(1)} + v_{0(4)} + v_{0(5)} + v_{1(1)} + v_{1(4)} + v_{1(5)} + \\ v_{2(1)} + v_{2(4)} + v_{2(5)} + v_{3(1)} + v_{3(4)} + v_{3(5)} \\ v_{0(2)} + v_{0(5)} + v_{0(6)} + v_{1(2)} + v_{1(5)} + v_{1(6)} + \\ v_{2(2)} + v_{2(5)} + v_{2(6)} + v_{3(2)} + v_{3(5)} + v_{3(6)} \\ v_{0(3)} + v_{0(6)} + v_{0(7)} + v_{1(3)} + v_{1(6)} + v_{1(7)} + \\ v_{2(3)} + v_{2(6)} + v_{2(7)} + v_{3(3)} + v_{3(6)} + v_{3(7)} \end{pmatrix} \quad (1\text{-}1)$$

$$= \begin{pmatrix} p_0 + c_5 + c_6 + c_7 \\ p_1 + c_4 + c_6 + c_7 \\ p_2 + c_4 + c_5 + c_7 \\ p_3 + c_4 + c_5 + c_6 \\ \\ \Sigma_{i=0\,to\,3}(v_{i(0)} + v_{i(4)} + v_{i(7)}) \\ \Sigma_{i=0\,to\,3}(v_{i(1)} + v_{i(4)} + v_{i(5)}) \\ \Sigma_{i=0\,to\,3}(v_{i(2)} + v_{i(5)} + v_{i(6)}) \\ \Sigma_{i=0\,to\,3}(v_{i(3)} + v_{i(6)} + v_{i(7)}) \end{pmatrix} \quad (1\text{-}2)$$

where it can be seen from equation (1-1) of expression 24 that, during the generation of the respective components of the column vector ($c_0, \ldots, c_7$) of the redundant portion of the SECDED code, the maximum number of terms added is 12 ($c_4, \ldots, c_7$) while the minimum number is 4 ($c_0, \ldots, c_3$). Thus, 12×4+4×4=64, so that a total of 64 terms are used.

A multiple-cycle generation process is considered. It is seen from equation (1-2) of expression 24 that each of the lower 4 bits ($c_4, \ldots, c_7$) of the redundant portion can be generated by performing four cycles of summing of three terms. Thus, in accordance with the present embodiment, the size of the circuit for generating the SECDED code can be further reduced, and the required operations can be simplified.

For comparison purposes, a case is described in which the SECDED code of 32 bit data is generated by using a check matrix of the SECDED code according to the relevant technology. In this case, the check matrix may be selected such that the number of times of addition during code generation can be minimized. The following is an example:

Expression 25

$$\begin{pmatrix} 11111000 & 00000001 & 11111111 & 00000000 & 1000000 \\ 10000111 & 10000001 & 11100000 & 11111000 & 0100000 \\ 01000100 & 01110001 & 00011100 & 11000111 & 0010000 \\ 00100010 & 01000000 & 10010011 & 00110110 & 0001000 \\ 00010001 & 00101010 & 01001010 & 10101101 & 0000100 \\ 00001000 & 10010110 & 00100101 & 01011011 & 0000010 \\ 11111111 & 11111110 & 00000000 & 00000000 & 0000001 \end{pmatrix}$$

In this case, the column vector ($c_0, \ldots, c_6$) as the redundant portion of the SECDED code is obtained as follows:

Expression 26

$$\begin{pmatrix} c_0 \\ c_1 \\ c_2 \\ c_3 \\ c_4 \\ c_5 \\ c_6 \end{pmatrix} = \begin{pmatrix} v_{0(0)} + v_{0(1)} + v_{0(2)} + v_{0(3)} + v_{0(4)} + v_{1(7)} + v_{2(0)} + \\ v_{2(1)} + v_{2(2)} + v_{2(3)} + v_{2(4)} + v_{2(5)} + v_{2(6)} + v_{2(7)} \\ v_{0(0)} + v_{0(5)} + v_{0(6)} + v_{0(7)} + v_{1(0)} + v_{1(7)} + v_{2(0)} + \\ v_{2(1)} + v_{2(2)} + v_{3(0)} + v_{3(1)} + v_{3(2)} + v_{3(4)} + v_{3(5)} \\ v_{0(1)} + v_{0(5)} + v_{1(1)} + v_{1(2)} + v_{1(3)} + v_{1(7)} + v_{2(3)} + \\ v_{2(4)} + v_{2(5)} + v_{3(0)} + v_{3(1)} + v_{3(5)} + v_{3(6)} + v_{3(7)} \\ v_{0(2)} + v_{0(6)} + v_{1(1)} + v_{2(0)} + v_{2(3)} + v_{2(6)} + v_{2(7)} + \\ v_{3(2)} + v_{3(3)} + v_{3(5)} + v_{3(6)} \\ v_{0(3)} + v_{0(7)} + v_{1(2)} + v_{1(4)} + v_{1(6)} + v_{2(1)} + v_{2(4)} + \\ v_{2(6)} + v_{3(0)} + v_{3(2)} + v_{3(4)} + v_{3(5)} + v_{3(7)} \\ v_{0(4)} + v_{1(0)} + v_{1(3)} + v_{1(5)} + v_{1(6)} + v_{2(2)} + v_{2(5)} + \\ v_{2(7)} + v_{3(1)} + v_{3(3)} + v_{3(4)} + v_{3(6)} + v_{3(7)} \\ v_{0(0)} + v_{0(1)} + v_{0(2)} + v_{0(3)} + v_{0(4)} + v_{0(5)} + v_{0(6)} + v_{0(7)} + \\ v_{1(0)} + v_{1(1)} + v_{1(2)} + v_{1(3)} + v_{1(4)} + v_{1(5)} + v_{1(6)} \end{pmatrix}$$

More specifically, in the check matrix according to expression 25, the 1st through 32nd values in row 1 are respectively multiplied by the 32 bits of the information portion v at top of expression 23. As a result, row 1 of the matrix on the right-hand side of expression 26 is obtained as the sum of the bits of the information portion v corresponding to "1" in the 32 bits in row 1 of the check matrix.

In the case of the example of expression 26, in the process of generating the respective components of the redundant portion of the SECDED code, the maximum number of terms added is 15 ($c_6$) and the minimum number is 11 ($c_3$). Thus, the total number of terms added is 14×3+11+13×2+15=94. Because the total number of terms added in accordance with the present embodiment is 64, 94/64=1.46875, indicating that the relevant technology requires about 1.5 times more terms than the present embodiment.

Further, the relevant technology as illustrated by expressions 25 and 26 cannot incorporate the simplification of operations (equation (1-2) of expression 24) which is possible in accordance with the present embodiment.

Thus, the present embodiment requires less calculation for generating the redundant portion of the SECDED code than the relevant technology. In other words, the present embodiment is superior to the relevant technology from the viewpoint of the size of the circuit for generating the redundant portion of the SECDED code, and freedom of designing the circuit. The present embodiment is also superior to the relevant technology from the viewpoint of delay (latency) of the operating process.

Substituting expression 23 into equation (5) of expression 22 that is used in generating the redundant portion of the byte parity code yields the following:

Expression 27

$$\begin{pmatrix} p_0 \\ p_1 \\ p_2 \\ p_3 \end{pmatrix} = \begin{pmatrix} c_0 \\ c_1 \\ c_2 \\ c_3 \end{pmatrix} + \begin{pmatrix} 0111 \\ 1011 \\ 1101 \\ 1110 \end{pmatrix} \begin{pmatrix} c_4 \\ c_5 \\ c_6 \\ c_7 \end{pmatrix}$$

$$= \begin{pmatrix} c_0 + c_5 + c_6 + c_7 \\ c_1 + c_4 + c_6 + c_7 \\ c_2 + c_4 + c_5 + c_7 \\ c_3 + c_4 + c_5 + c_6 \end{pmatrix} \quad (1\text{-}3)$$

It can be seen from equation (1-3) that the number of terms required for generating each of the parity bits ($p_0, \ldots, p_3$) is four in the case of the present embodiment.

On the other hand, in the case of generating the parity bits by the relevant technology, the following equation is obtained:

Expression 28

$$\begin{pmatrix} p_0 \\ p_1 \\ p_2 \\ p_3 \end{pmatrix} = \begin{pmatrix} v_{0(0)} + v_{0(1)} + v_{0(2)} + v_{0(3)} + v_{0(4)} + v_{0(5)} + v_{0(6)} + v_{0(7)} \\ v_{1(0)} + v_{1(1)} + v_{1(2)} + v_{1(3)} + v_{1(4)} + v_{1(5)} + v_{1(6)} + v_{1(7)} \\ v_{2(0)} + v_{2(1)} + v_{2(2)} + v_{2(3)} + v_{2(4)} + v_{2(5)} + v_{2(6)} + v_{2(7)} \\ v_{3(0)} + v_{3(1)} + v_{3(2)} + v_{3(3)} + v_{3(4)} + v_{3(5)} + v_{3(6)} + v_{3(7)} \end{pmatrix}$$

Thus, in the case of the relevant technology, the number of terms required for generating each of the parity bits ($p_0, \ldots, p_3$) is 8, i.e., twice as many as in the case of the present embodiment illustrated by expression 27. Thus, it can be said that the present embodiment is also superior to the relevant technology from the viewpoint of required circuit size as regards the generation of the byte parity code, for example.

In equation (4) of expression 21 derived from the respective elements within the check matrix H according to expression 1 for the SECDED code according to the present embodiment, the matrix B appears repeatedly. This means that a small-sized logic module can be repeatedly used in a logic process for generating the redundant portion of the SECDED code. For example, a logic verifying process may be performed on the small-sized module unit basis. In contrast, in accordance with the relevant technology using the Hamming code, the circuit for generating the redundant portion of the SECDED code does not have any specific regularity, so that the logic verifying process has to be performed on the entire check matrix. Thus, in accordance with the present embodiment, a logic verifying process for the logic circuit can be simplified compared with the relevant technology, so that verification coverage improves.

Next, a case where the check matrix (2) of expression 10 is used is described. When equation (4) of expression 21 is calculated based on the check matrix (2), the expression (2-1) is obtained via expressions 29 and 30:

Expression 29

$$\begin{pmatrix} c_0 \\ c_1 \\ c_2 \\ c_3 \\ c_4 \\ c_5 \\ c_6 \\ c_7 \end{pmatrix} = \left( \begin{pmatrix} p_0 \\ p_1 \\ p_2 \\ p_3 \end{pmatrix} + \begin{pmatrix} 1000 \\ 0100 \\ 0010 \\ 0001 \end{pmatrix} \begin{pmatrix} c_4 \\ c_5 \\ c_6 \\ c_7 \end{pmatrix} \right.$$

$$\begin{pmatrix} 10011010 \\ 11000111 \\ 01101011 \\ 00110101 \end{pmatrix} \begin{pmatrix} v_{0(0)} \\ v_{0(1)} \\ v_{0(2)} \\ v_{0(3)} \\ v_{0(4)} \\ v_{0(5)} \\ v_{0(6)} \\ v_{0(7)} \end{pmatrix} + \begin{pmatrix} 10011010 \\ 11000111 \\ 01101011 \\ 00110101 \end{pmatrix} \begin{pmatrix} v_{1(0)} \\ v_{1(1)} \\ v_{1(2)} \\ v_{1(3)} \\ v_{1(4)} \\ v_{1(5)} \\ v_{1(6)} \\ v_{1(7)} \end{pmatrix} +$$

$$\left. \begin{pmatrix} 10011010 \\ 11000111 \\ 01101011 \\ 00110101 \end{pmatrix} \begin{pmatrix} v_{2(0)} \\ v_{2(1)} \\ v_{2(2)} \\ v_{2(3)} \\ v_{2(4)} \\ v_{2(5)} \\ v_{2(6)} \\ v_{2(7)} \end{pmatrix} + \begin{pmatrix} 10011010 \\ 11000111 \\ 01101011 \\ 00110101 \end{pmatrix} \begin{pmatrix} v_{3(0)} \\ v_{3(1)} \\ v_{3(2)} \\ v_{3(3)} \\ v_{3(4)} \\ v_{3(5)} \\ v_{3(6)} \\ v_{3(7)} \end{pmatrix} \right)$$

Expression 30

$$\begin{pmatrix} p_0 + c_4 \\ p_1 + c_5 \\ p_2 + c_6 \\ p_3 + c_7 \end{pmatrix} \quad (2\text{-}1)$$

$$= \begin{pmatrix} v_{0(0)} + v_{0(3)} + v_{0(4)} + v_{0(6)} + v_{1(0)} + v_{1(3)} + v_{1(4)} + v_{1(6)} + \\ v_{2(0)} + v_{2(3)} + v_{2(4)} + v_{2(6)} + v_{3(0)} + v_{3(3)} + v_{3(4)} + v_{3(6)} \\ v_{0(0)} + v_{0(1)} + v_{0(4)} + v_{0(5)} + v_{0(6)} + v_{1(0)} + v_{1(1)} + v_{1(4)} + \\ v_{1(5)} + v_{1(6)} + v_{2(0)} + v_{2(1)} + v_{2(4)} + v_{2(5)} + v_{2(6)} + v_{3(0)} + \\ v_{3(1)} + v_{3(4)} + v_{3(5)} + v_{3(6)} \\ v_{0(1)} + v_{0(2)} + v_{0(4)} + v_{0(6)} + v_{0(7)} + v_{1(1)} + v_{1(2)} + v_{1(4)} + \\ v_{1(6)} + v_{1(7)} + v_{2(1)} + v_{2(2)} + v_{2(4)} + v_{2(6)} + v_{2(7)} + v_{3(1)} + \\ v_{3(2)} + v_{3(4)} + v_{3(6)} + v_{3(7)} \\ v_{0(2)} + v_{0(3)} + v_{0(5)} + v_{0(7)} + v_{1(2)} + v_{1(3)} + v_{1(5)} + v_{1(7)} + \\ v_{2(2)} + v_{2(3)} + v_{2(5)} + v_{2(7)} + v_{3(2)} + v_{3(3)} + v_{3(5)} + v_{3(7)} \end{pmatrix}$$

$$= \begin{pmatrix} p_0 + c_4 \\ p_1 + c_5 \\ p_2 + c_6 \\ p_3 + c_7 \\ \\ \Sigma_{i=0 \, to \, 3}(v_{i(0)} + v_{i(3)} + v_{i(4)} + v_{i(6)}) \\ \Sigma_{i=0 \, to \, 3}(v_{i(0)} + v_{i(1)} + v_{i(4)} + v_{i(5)} + v_{i(6)}) \\ \Sigma_{i=0 \, to \, 3}(v_{i(1)} + v_{i(2)} + v_{i(4)} + v_{i(6)} + v_{i(7)}) \\ \Sigma_{i=0 \, to \, 3}(v_{i(2)} + v_{i(3)} + v_{i(5)} + v_{i(7)}) \end{pmatrix}$$

In the logic relating to the generation of the redundant portion of the SECDED code, it is seen from equation (2-1) of expression 30 that the maximum number of terms added ($c_5$, $c_6$) is 20 and the minimum number of terms added ($c_0, \ldots, c_3$) is two. Thus, there is more variation than in the case of equation (1-2) of expression 24 involving the use of the check matrix (1) according to expression 8. In the equation (2-1) as a whole, 80 terms are used, which is smaller than the number of terms required by the relevant technology (94) but more than in the case of the check matrix (1). On the other hand, substituting the check matrix (2) in equation (5) of expression 22 for generating the redundant portion of the byte parity code yields the following:

Expression 31

$$\begin{pmatrix} p_0 \\ p_1 \\ p_2 \\ p_3 \end{pmatrix} = \begin{pmatrix} c_0 \\ c_1 \\ c_2 \\ c_3 \end{pmatrix} + \begin{pmatrix} 1000 \\ 0100 \\ 0010 \\ 0001 \end{pmatrix} \begin{pmatrix} c_4 \\ c_5 \\ c_6 \\ c_7 \end{pmatrix}$$

$$= \begin{pmatrix} c_0 + c_4 \\ c_1 + c_5 \\ c_2 + c_6 \\ c_3 + c_7 \end{pmatrix} \quad (2\text{-}2)$$

It can be seen from equation (2-2) that the number of terms required for generating each of the parity bits is two. Thus, the check matrix used may be selected depending on the purpose. For example, the check matrix (1) may be used when it is desired to simplify the logic for generating the redundant portion of the SECDED code, while using the check matrix (2) when it is desired to simplify the logic for generating the redundant portion of the byte parity code.

FIG. 1 illustrates a circuit for generating the redundant portion of the SECDED code according to the relevant technology. The circuit is configured to realize the logic of expression 32.

$$\begin{pmatrix} c_0 \\ c_1 \\ \vdots \\ c_{k-1} \end{pmatrix} = \begin{pmatrix} G_0(v) \\ G_1(v) \\ \vdots \\ G_{k-1}(v) \end{pmatrix} = G \cdot v^t \quad \text{Expression 32}$$

where $G_i(v)$ ($i=0, \ldots, k-1$), namely $G_i$ ($i=0, \ldots, k-1$), $11_0, 11_1, \ldots, 11_{m-1}, 11_m, \ldots, 11_{k-1}$ in FIG. 1, are functions to which the information portion v is inputted, the functions corresponding to multiple-input XOR circuits to which some of the components of the vector v are inputted. "G" in the right-hand side member of expression 32 indicates a generating matrix used for generating the redundant portion of the SECDED code.

Figure 2:
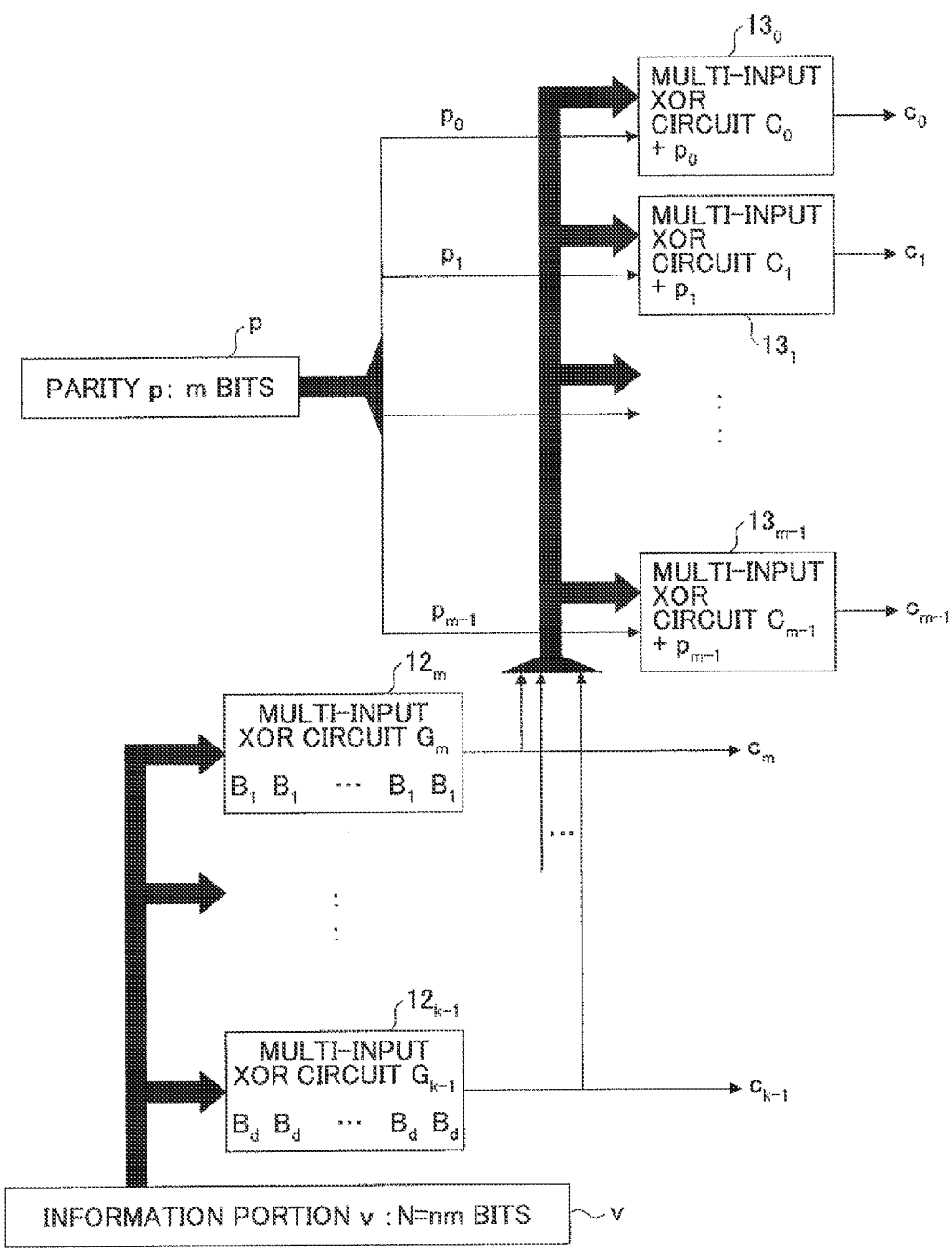
FIG. 2 illustrates a circuit for generating a redundant portion of the SECDED code according to an embodiment of the present invention.

FIG. 2 illustrates a circuit for generating the redundant portion of the SECDED code according to the present embodiment. The circuit realizes the logic according to expressions 33 and 34.

$$\begin{pmatrix} c_0 \\ c_1 \\ \vdots \\ c_{m-1} \end{pmatrix} = \begin{pmatrix} p_0 + C_0(c_2) \\ p_1 + C_1(c_2) \\ \vdots \\ p_{m-1} + C_{m-1}(c_2) \end{pmatrix} = p^t + C \cdot c_2^t \quad \text{Expression 33}$$

$$\begin{pmatrix} c_m \\ c_{m+1} \\ \vdots \\ c_{k-1} \end{pmatrix} = \begin{pmatrix} G_m(v) \\ G_{m+1}(v) \\ \vdots \\ G_{k-1}(v) \end{pmatrix} \quad \text{Expression 34}$$

$$= \begin{pmatrix} B_1(v_0) + B_1(v_1) + \ldots + B_1(v_{m-1}) \\ B_2(v_0) + B_2(v_1) + \ldots + B_2(v_{m-1}) \\ \vdots \\ B_d(v_0) + B_d(v_1) + \ldots + B_d(v_{m-1}) \end{pmatrix}$$

$$= B \cdot v_0^t + B \cdot v_1^t + \ldots + B \cdot v_{m-1}^t$$

Expression 33 corresponds to the upper m bits of equation (4) of expression 21. Expression 34 corresponds to the lower d bits of equation (4) of expression 21.

Each $C_i(c_2)$ ($i=0, \ldots, m-1$) in Expression 33, i.e., $C_i$ ($i=0, \ldots, m-1$), $13_0, 13_1, \ldots, 13_{m-1}$ in FIG. 2, is a function to which $c_2$ is inputted, i.e., a multiple-input XOR circuit to which some of the components of vector $c_2$ are inputted. "C" in the right-hand side member of expression 33 indicates the matrix C defined in the definition of the check matrix H according to expression 6.

In expression 34, each $G_i(v)$ ($i=m, \ldots, k-1$); namely, each $G_i$ ($i=m, \ldots, k-1$), $12_m, \ldots, 12_{k-1}$ in FIG. 2, is a function to which the information portion v is inputted, namely a multiple-input XOR circuit to which some of the components of the vector v are inputted.

In expression 34, each $B_i(v_j)$, namely each $B_i$ in FIG. 2, is a function to which $v_j$ is inputted, namely a multiple-input XOR circuit to which some of the components of the vector $v_j$ are inputted. "B" in the right-hand side member of expression 34 indicates the matrix B defined in the definition of the check matrix H of expression 5.

Figure 3:
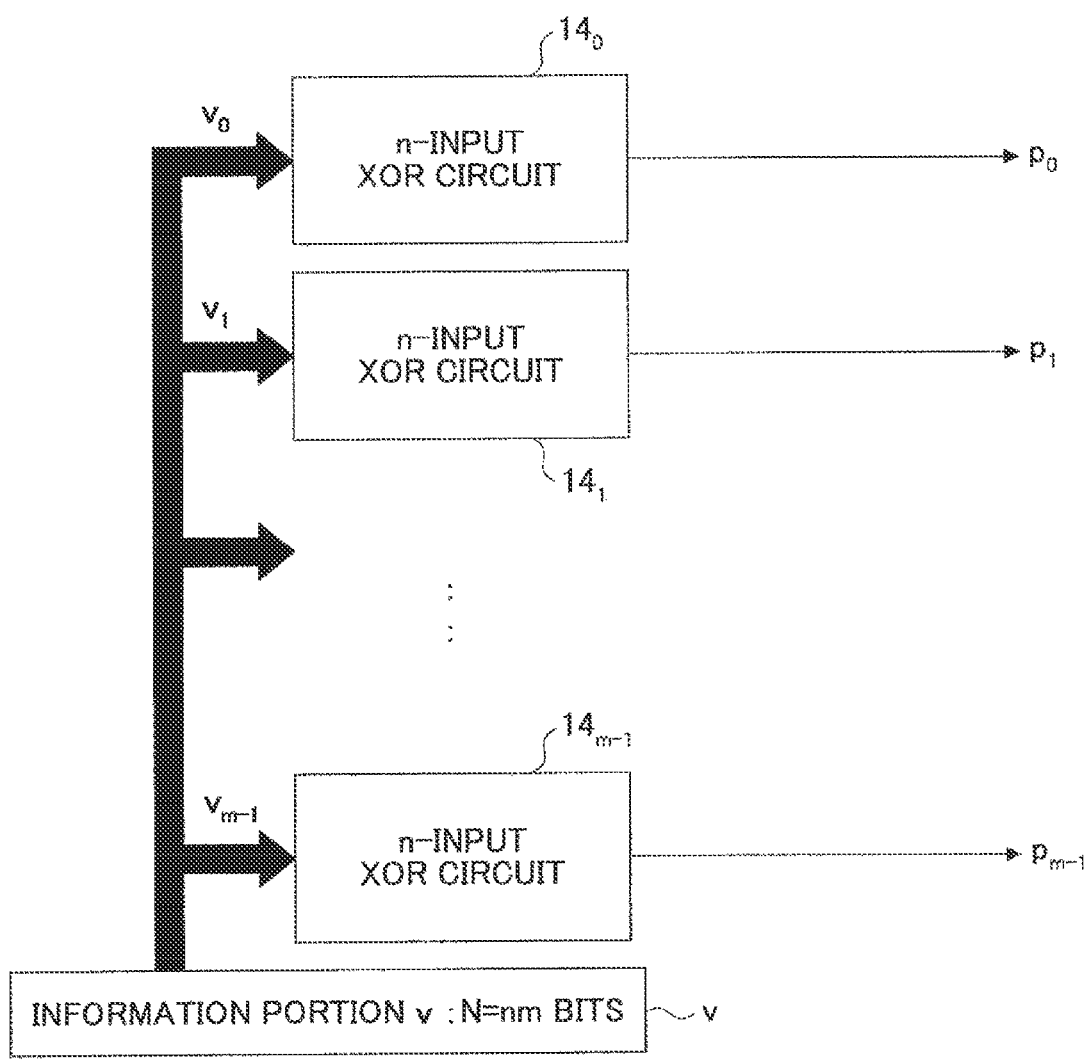
FIG. 3 illustrates a circuit for generating a redundant portion of a byte parity code.

FIG. 3 illustrates a circuit for generating the redundant portion of the byte parity code according to the relevant technology. In FIG. 3, each $p_i$ ($i=0, \ldots, m-1$) indicates each of the parity bits defined by expression 35 (same as expression 15). In FIG. 3, each $14i$ ($i=0, \ldots, m-1$) indicates a n-input XOR circuit to which each component $v_i(j)$ ($i=0, \ldots, m-1, j=0, \ldots, n-1$) of the information portion v is inputted.

Expression 35:

$$p_i = v_{i(0)} + v_{i(1)} + \ldots + v_{i(n-2)} + v_{i(n-1)}$$

Figure 4:
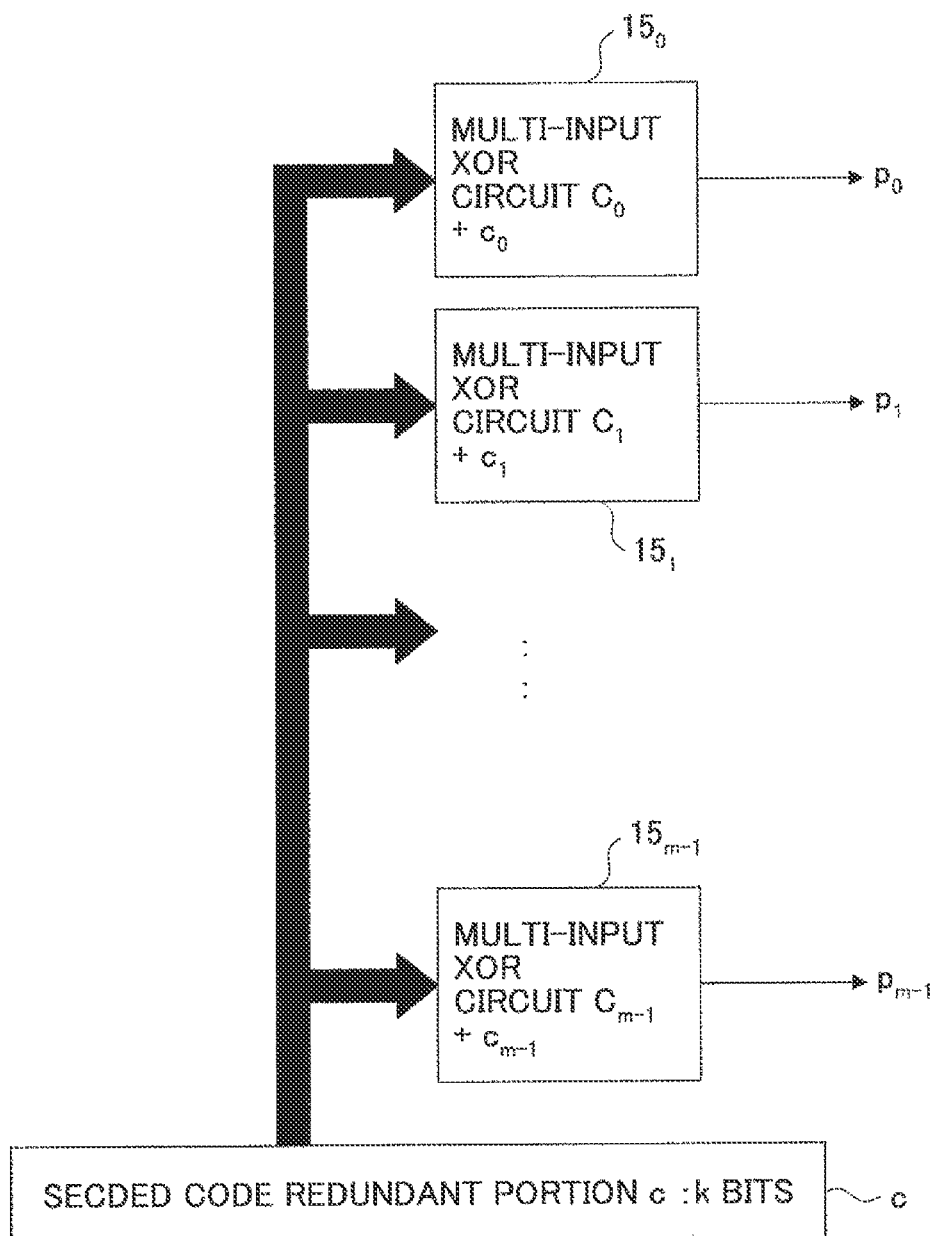
FIG. 4 illustrates a circuit for generating a redundant portion of the byte parity code according to an embodiment of the present invention.

FIG. 4 illustrates a circuit for generating the redundant portion of the byte parity code according to the present embodiment. The circuit realizes the logic according to expression 36.

$$\begin{pmatrix} p_0 \\ p_1 \\ \vdots \\ p_{m-1} \end{pmatrix} = \begin{pmatrix} c_0 + C_0(c_2) \\ c_1 + C_1(c_2) \\ \vdots \\ c_{m-1} + C_{m-1}(c_2) \end{pmatrix} = c_1^t + C \cdot c_2^t \quad \text{Expression 36}$$

In FIG. 4, each $C_i$ ($i=0, \ldots, m-1$), $15_0, 15_1, \ldots, 15_{m-1}$, i.e., each $C_i(c_2)$ ($i=0, \ldots, m-1$) in expression 36, is a function to which $c_2$ is inputted, namely a multiple-input XOR circuit to which some of the components of the vector $c_2$ are inputted. "C" in the right-hand side member of expression 36 indicates the matrix C defined in the definition of the check matrix H according to expression 6.

With reference to FIGS. 5 through 10, more specific examples of the circuit structures depicted in FIGS. 1 through 4 are described based on the assumption that the information portion is comprised of 32 bits of data where n=8 and m=4.

The 32 bits of information portion v are expressed as follows:

Expression 37:

$$v = v_{0(0)}, v_{0(1)}, v_{0(2)}, v_{0(3)}, v_{0(4)}, v_{0(5)}, v_{0(6)}, v_{0(7)}, v_{1(0)}, \ldots, v_{1(7)}, v_{2(0)}, \ldots, v_{2(7)}, v_{3(0)}, \ldots, v_{3(7)})$$

where each $v_{i(j)} = 0$ or $1$
where the subscripts of the components of the information portion v may be expressed as follows as needed:

Expression 38:

$$v = (v_0, v_1, v_2, v_3, v_4, v_5, v_6, v_7, v_8, v_9, v_{10}, \ldots, v_{29}, v_{30}, v_{31})$$

The bits of the components of v according to expression 38 and the bits of the components of v according to expression 37 have the following relationship successively from the left:

Expression 39:

$$v_{i(j)} = v_{8i+j}, (i \text{ and } j \text{ are integers: } 0 \leq i \leq 3, 0 \leq j \leq 7)$$

Because m=4, there are four parity bits as indicated below:

Expression 40:

$$p = (p_0, p_1, p_2, p_3) : \text{Each } p_i = 0 \text{ or } 1$$

Thus, the byte parity code ($\alpha$) is expressed as follows, and the data includes 32+4=36 bits:

Expression 41:

$$\alpha = vp = (v_0, v_1, v_2, v_3, v_4, v_5, v_6, v_7, v_8, v_9, v_{10}, \ldots, v_{29}, v_{30}, v_{31}, p_0, p_1, p_2, p_3)$$

Further, $d = [\log_2(8+1)] = 4$ according to the following expression:

Expression 42:

$$[\log_2(n+1)] = [\log_2(8+1)] = [\log_2 9] = [3.1699250014423126\ldots] = 4$$

Thus, the size of the SECDED code ($\beta$) is $\alpha + 4 = 36 + 4 = 40$ bits. The size of the redundant portion c of the SECDED code $\beta$ is $40 - 32 = 8$ bits. Further, the redundant portion c of the SECDED code $\beta$ and the SECDED code $\beta$ are expressed as follows:

Expression 43:

$$c = (c_1, c_2) = c_0, c_1, c_2, c_3, c_4, c_5, c_6, c_7) : \text{Each } c_i = 0 \text{ or } 1$$

$$\beta = vc = (v_0, v_1, v_2, v_3, v_4, v_5, v_6, v_7, v_8, v_9, v_{10}, \ldots, v_{29}, v_{30}, v_{31}, c_0, c_1, c_2, c_3, c_4, c_5, c_6, c_7)$$

Of the redundant portion of $\beta$, $\log_2(n+1)$ bits=$\beta^*$ (i.e., d bits), are expressed as follows:

Expression 44:

$$\beta^* = c_2 = (c_4, c_5, c_6, c_7)$$

The m bits of the redundant portion of the remaining $\beta$ is expressed as follows:

Expression 45:

$$c_1 = (c_0, c_1, c_2, c_3)$$

Figure 5:
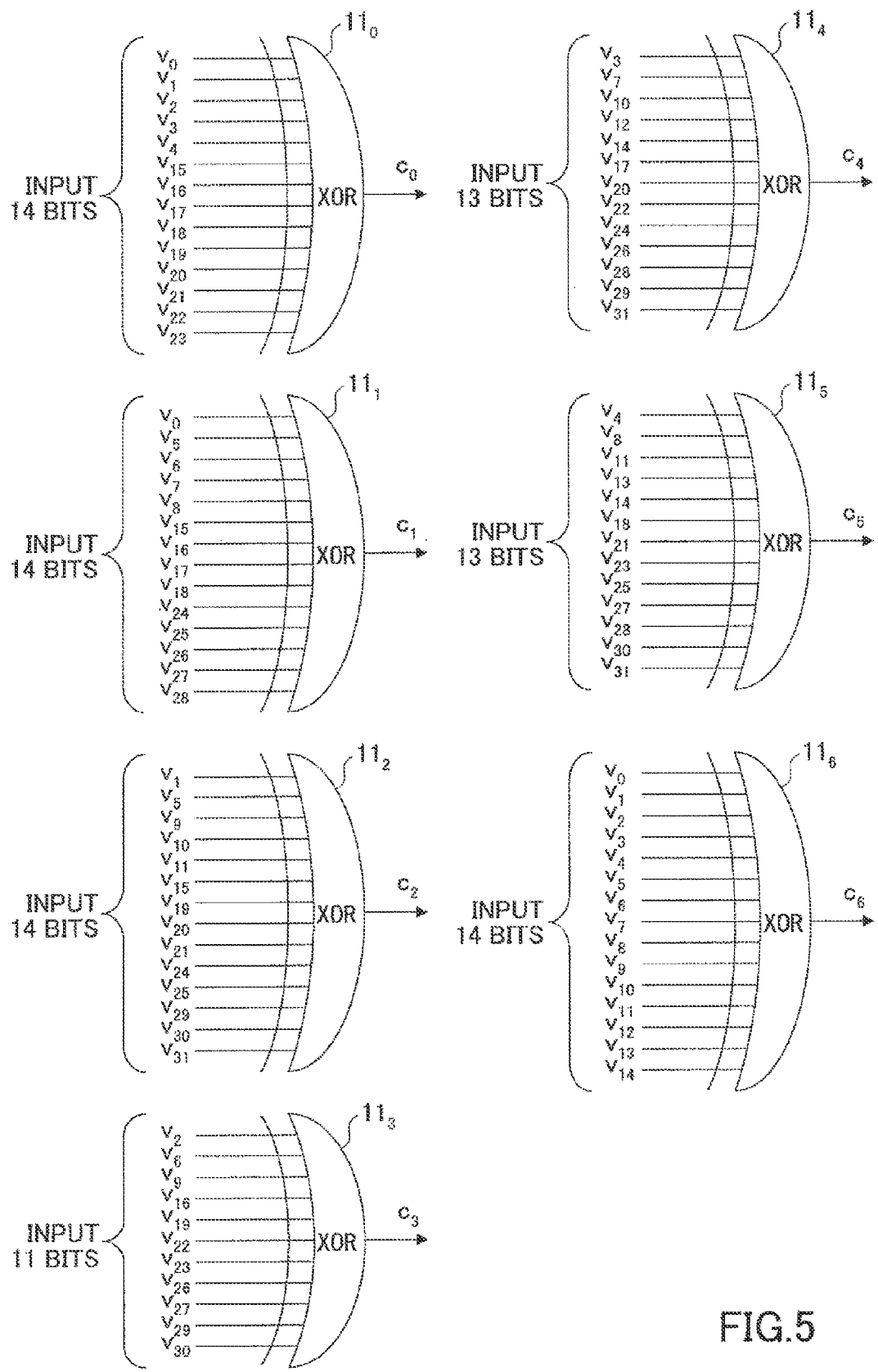
FIG. 5 illustrates a specific example of the circuit structure illustrated in FIG. 1.

FIG. 5 illustrates a concrete example of the circuit structure illustrated in FIG. 1. The example includes seven XOR circuits $11_0, \ldots, 11_6$ and is configured to realize the logic according to expression 26.

Figure 6:
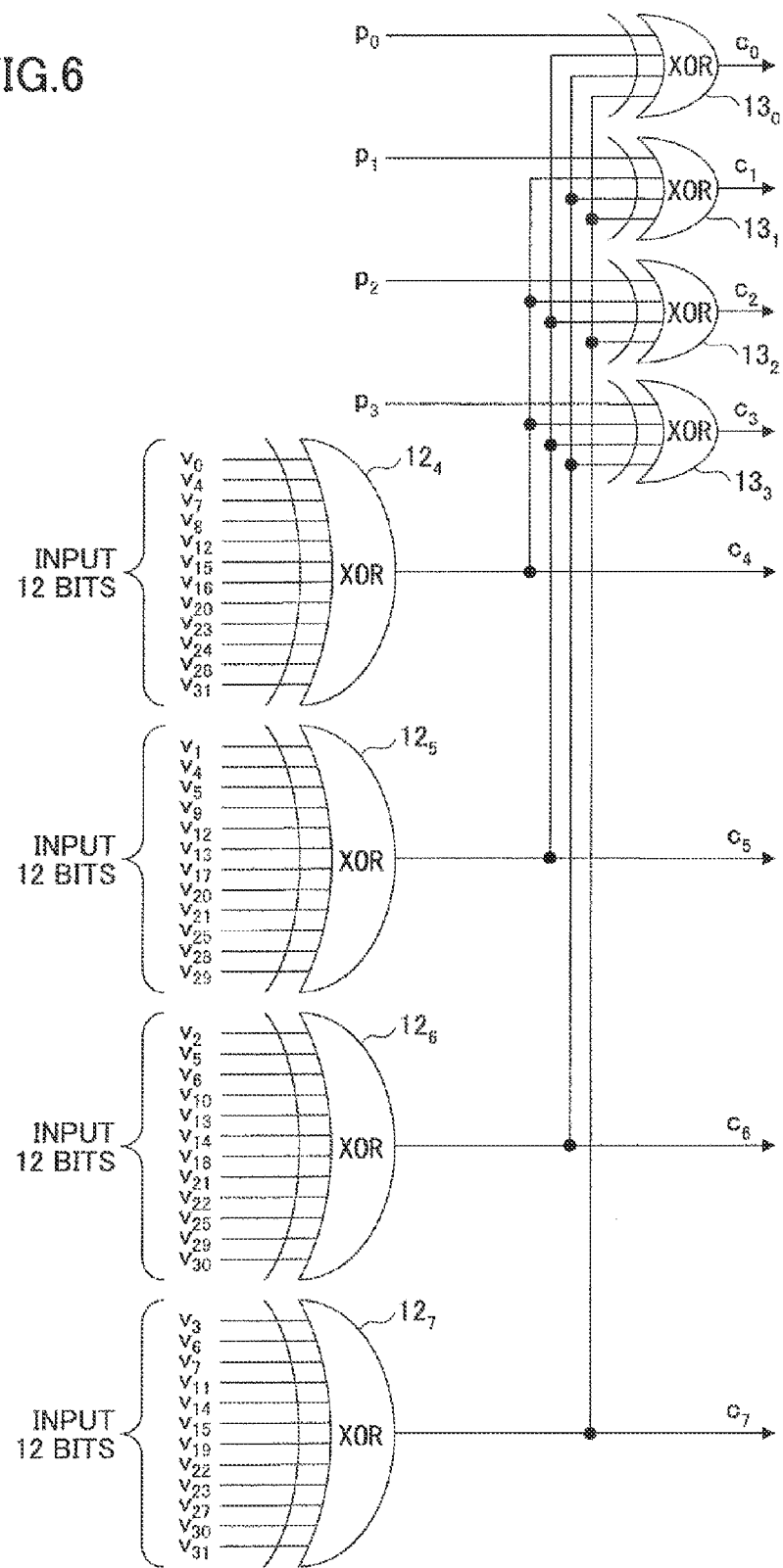
FIG. 6 illustrates a first example of the circuit structure illustrated in FIG. 2.

FIG. 6 illustrates a first example of the circuit structure illustrated in FIG. 2. The first example is a conversion circuit (corresponding to the ECC generating circuit 2 illustrated in FIGS. 11 and 12) that generates the SECDED code from the byte parity code. The conversion circuit illustrated in FIG. 6 is based on the check matrix H expressed by equation (1) of expression 8, and it realizes the logic according to equations (1-1) and (1-2) of expression 24. In FIG. 6, the four XOR circuits $13_0, \ldots, 13_3$ are configured to generate the upper m bits ($c_0, \ldots, c_3$) of the redundant portion of the SECDED code, while the other four XOR circuits $12_4, \ldots, 12_7$ are configured to generate the lower d bits ($c_4, \ldots, c_7$) of the redundant portion of the SECDED code.

In accordance with the embodiment illustrated in FIG. 6, the lower d bits ($c_4, \ldots, c_7$) of the redundant portion of the SECDED code $\beta$, i.e., $\log_2(n+1) = 4$ bits ($\beta^*$), are generated based on the information portion v of the byte parity code $\alpha$. The redundant portion of the remaining $\beta$ (namely, m=4 bits) ($c_0, \ldots, c_3$) is generated only from the parity bits ($p_0, \ldots, p_3$) of the byte parity code $\alpha$ and the $\beta^*(c_4, \ldots, c_7)$ generated as described above.

Figure 7:
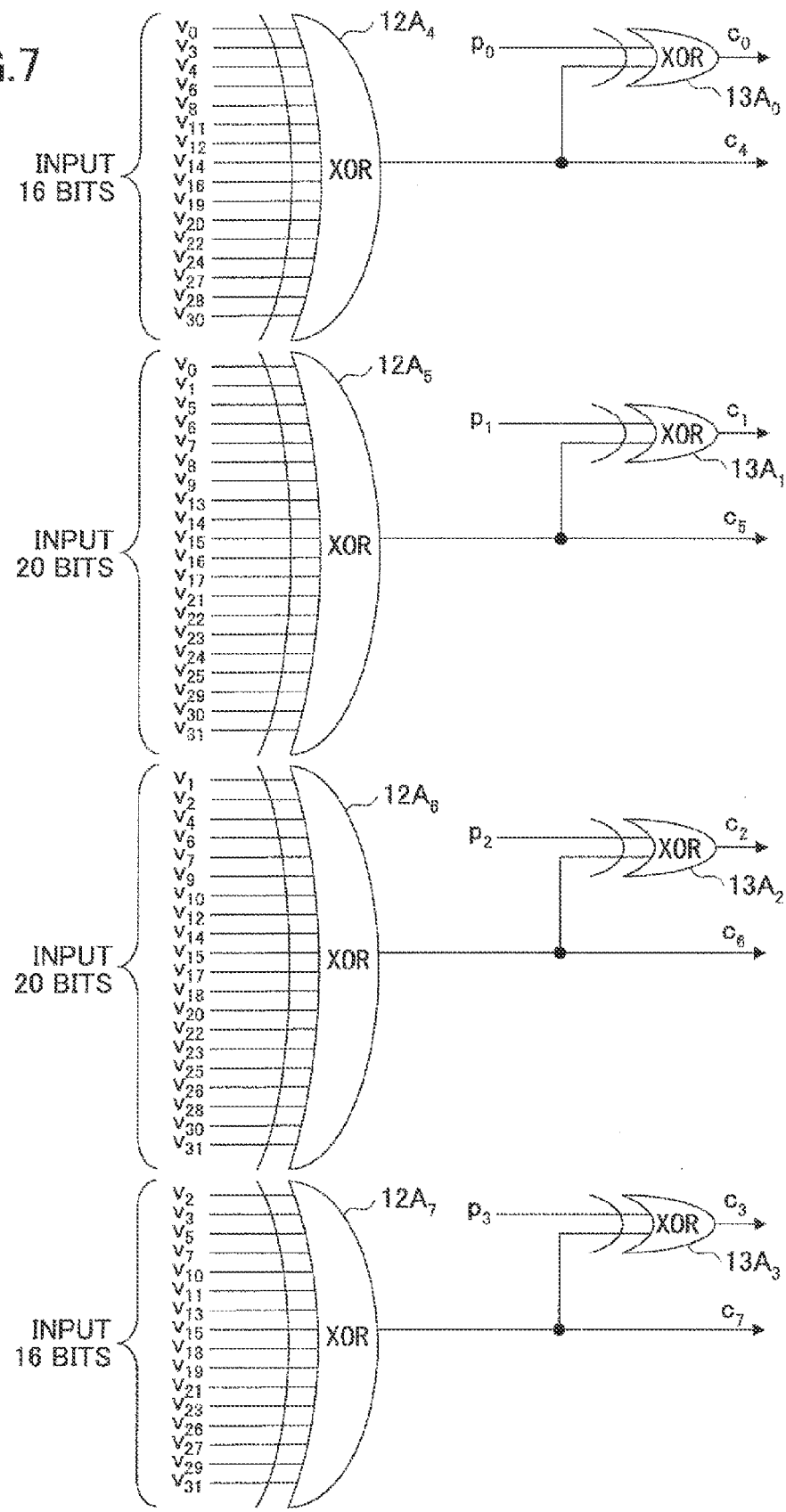
FIG. 7 illustrates a second example of the circuit structure illustrated in FIG. 2.

FIG. 7 illustrates a second example of the circuit structure illustrated in FIG. 2. The second example is a conversion circuit (ECC generating circuit 2 in FIGS. 11 and 12) that generates the SECDED code from the byte parity code according to the first embodiment of the present invention. The circuit of FIG. 7 is based on the check matrix H expressed by equation (2) of expression 10 and configured to realize the logic according to equation (2-1) of expression 30. In FIG. 7, the four XOR circuits $13A_0, \ldots, 13A_3$ are configured to generate the upper m bits ($c_0, \ldots, c_3$) of the redundant portion of the SECDED code, and the other four XOR circuits $12A_4, \ldots, 12A_7$ are configured to generate the lower d bits ($c_4, \ldots, c_7$) of the redundant portion of the SECDED code.

As illustrated in FIG. 7, in accordance with the present embodiment, as in the case of FIG. 6, the lower d bits ($c_4, \ldots, c_7$) of the redundant portion of the SECDED code $\beta$, namely $\log_2(n+1) = 4$ bits ($\beta^*$), are generated based on the information portion v of the byte parity code $\alpha$. The remaining redundant portion of $\beta$ (namely m=4 bits) ($c_0, \ldots, c_3$), are generated only from the parity bits ($p_0, \ldots, p_3$) of the byte parity code $\alpha$ and the $\beta^*(c_4, \ldots, c_7)$ generated as described above.

Figure 8:
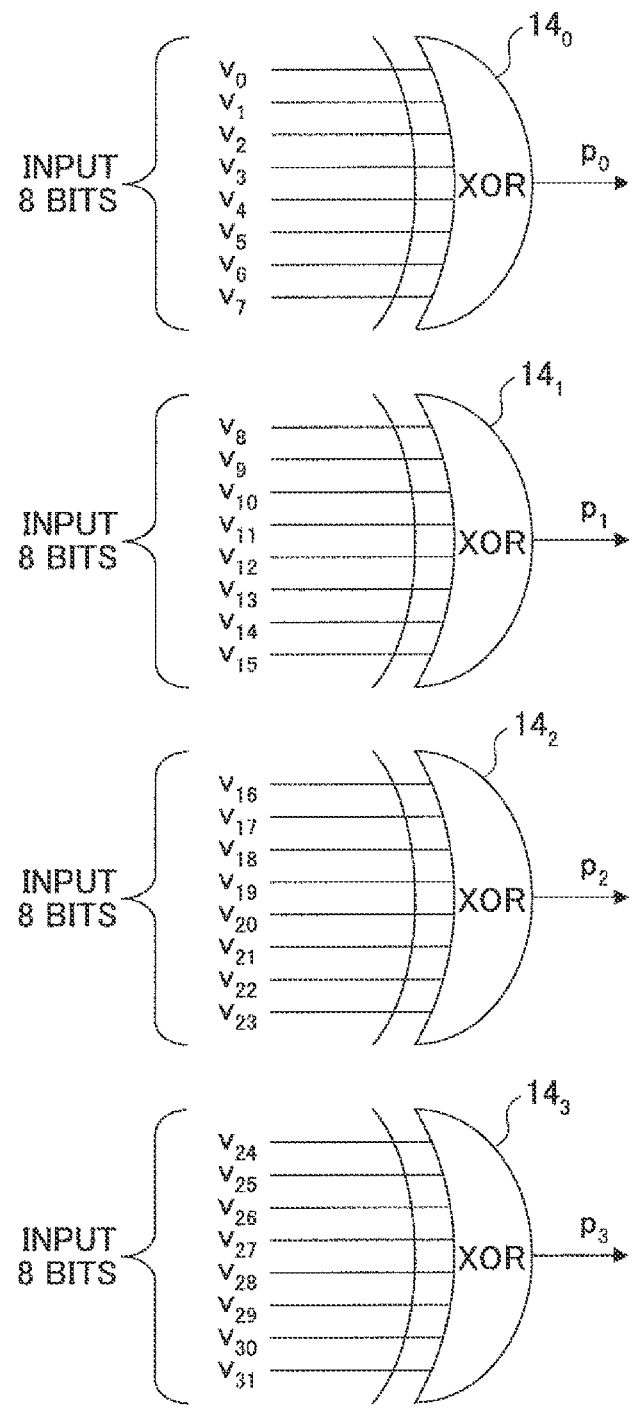
FIG. 8 illustrates a specific example of the circuit structure illustrated in FIG. 3.

FIG. 8 illustrates a specific example of the circuit structure depicted in FIG. 3. The example is configured to generate the byte parity code by the relevant technology. The circuit includes four XORs $14_0, \ldots, 14_3$ and is configured to realize the logic according to expression 28.

Figure 9:
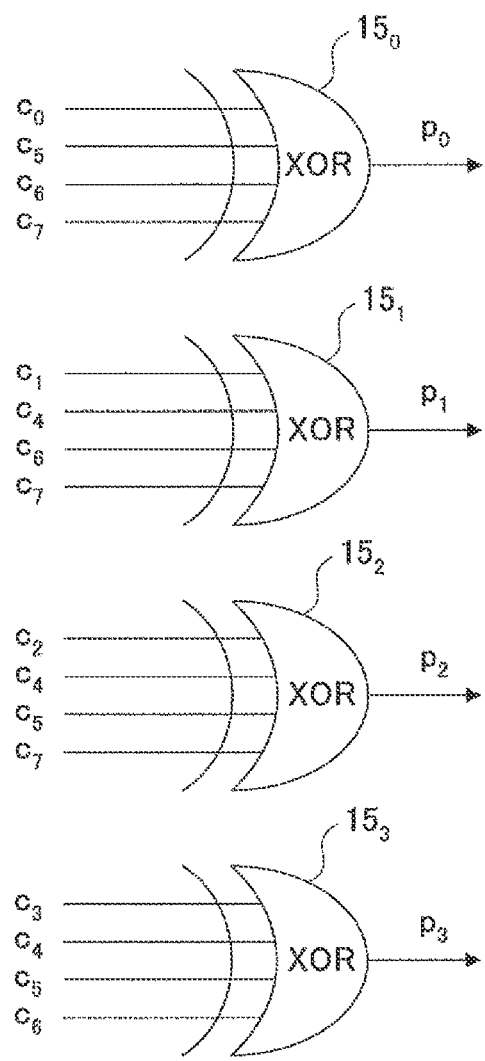
FIG. 9 illustrates a first example of the circuit structure illustrated in FIG. 4.

FIG. 9 illustrates a first example of the circuit structure illustrated in FIG. 4. The example is a conversion circuit (corresponding to the parity generating circuit 5 in FIGS. 11 and 12) for generating the byte parity code from the SECDED code according to the present embodiment. The circuit of FIG. 9 is based on the check matrix H expressed by equation (1) of expression 8, and is configured to realize the logic of equation (1-3) of expression 27 by using four XORs $15_0, \ldots, 15_3$. According to the present embodiment, the circuit generates an arbitrary one of the parity bits of the byte parity code $\alpha$ as described above, from a number of bits equal to or less than $[\log_2(n+1)] = 4$ bits (as in the example of FIG. 9).

Figure 10:
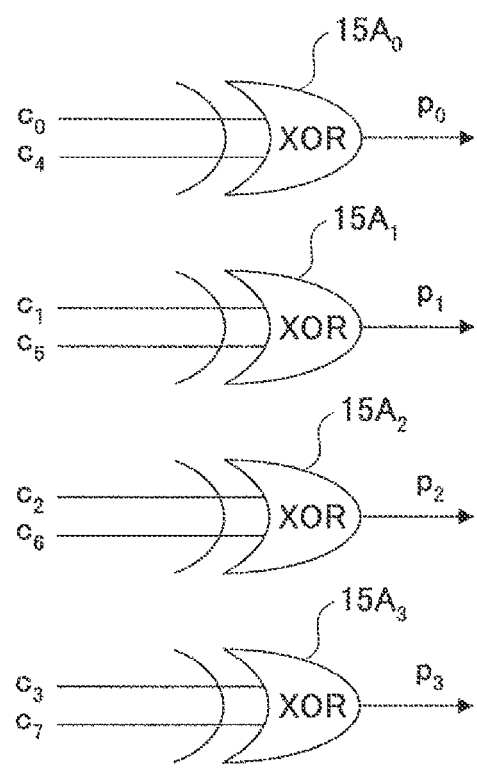
FIG. 10 illustrates a second example of the circuit structure illustrated in FIG. 4.

FIG. 10 illustrates a second example of the circuit structure depicted in FIG. 4. The example is a conversion circuit (parity generating circuit 5 in FIGS. 11 and 12) that generates the byte parity code from the SECDED code according to the present embodiment. The circuit of FIG. 10 is based on the check matrix H expressed by equation (2) of expression 10, and is configured to realize the logic of equation (2-2) of expression 31 by using four XORs $15A_0, \ldots, 15A_3$. In accordance with the present embodiment, the circuit generates, as described above, an arbitrary one of the parity bits of the byte parity code a from a number of bits equal to or less than $\log_2(n+1)=4$ bits (which is two in the example of FIG. 10).

Figure 11:
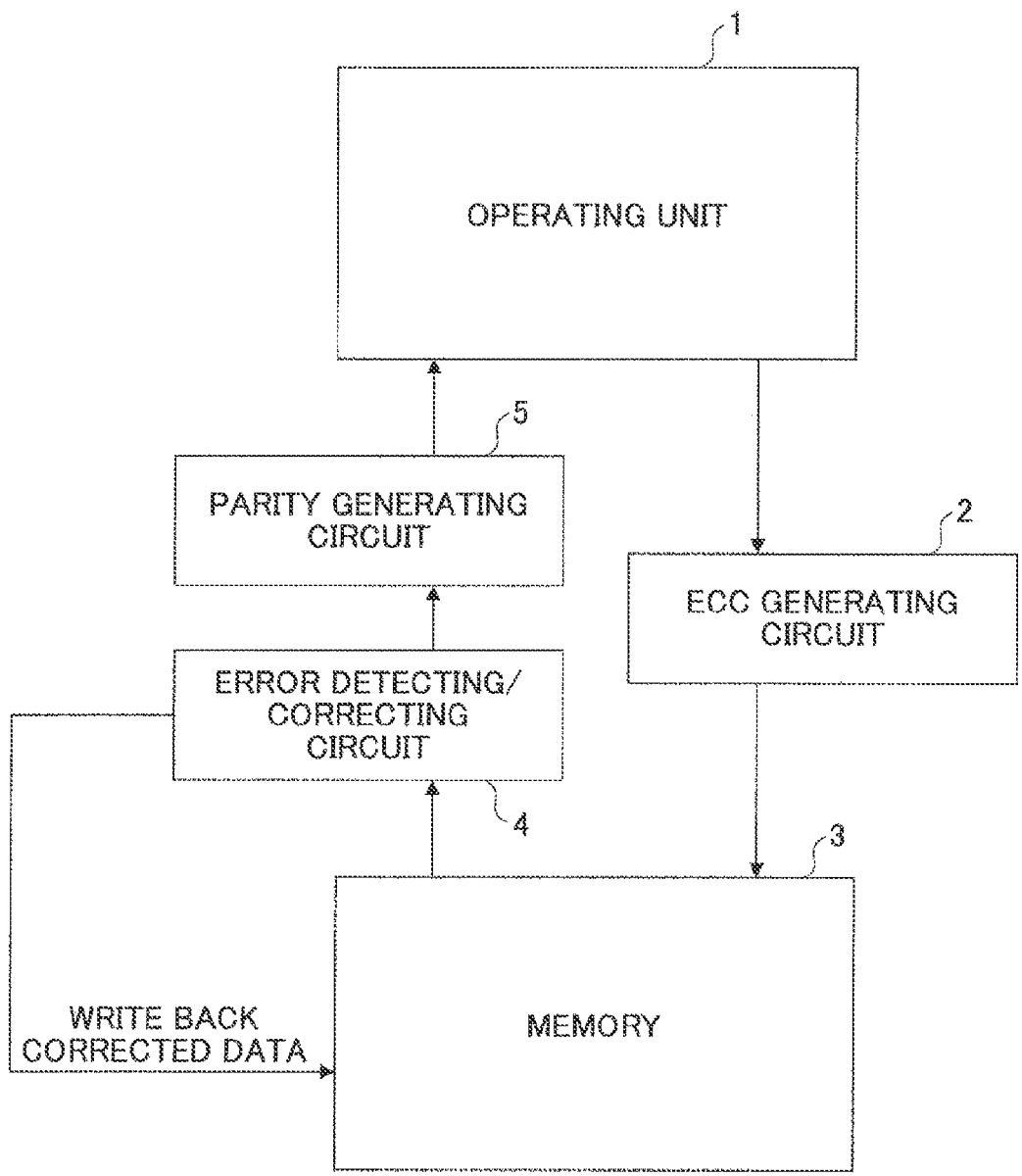
FIG. 11 is a block diagram of a data operating unit according to an embodiment of the present invention.

FIG. 11 is a block diagram of a data operating unit according to an embodiment of the present invention. The data operating unit includes an operating unit 1, an ECC generating circuit 2, a memory 3, an error detecting/correcting circuit 4, and a parity generating circuit 5.

The memory 3 stores data of the SECDED code format according to the foregoing embodiments. The operating unit 1 reads the data from the memory 3 and executes an operating process on the data. Specifically, the error detecting/correcting circuit 4 first performs an error detecting/correcting process on the data. The error detecting/correcting circuit 4, which may include the RAS circuit, detects an error in the information portion of the SECDED code by using the redundant portion of the SECDED code read from the memory 3. As described above, the SECDED code is configured to enable detection and correction of a single-bit error and detection of a double-bit error. Therefore, the error detecting/correcting circuit 4 can detect and correct a single-bit error and detect a double-bit error in the information portion of the SECDED code. After the error detecting/correcting process, the error detecting/correcting circuit 4 delivers the SECDED code to the parity generating circuit 5. When correcting a bit error, the error detecting/correcting circuit 4 may overwrite a corrected bit in the memory 3.

The parity generating circuit 5 converts the SECDED code provided by the error detecting/correcting circuit 4 into the byte parity code, and sends the byte parity code to the operating unit 1. The parity generating circuit 5 may have a structure illustrated in FIG. 4. In this case, the parity generating circuit 5, based on the redundant portion of the SECDED code, generates the parity bits $p_0, \ldots, p_{m-1}$ of the redundant portion of the byte parity code, using the XOR circuits $15_0, \ldots, 15_{m-1}$. The parity generating circuit 5 then attaches the parity bits to the information portion of the SECDED code, thereby obtaining the byte parity code which is sent to the operating unit 1.

The operating unit 1 executes an operating process on the byte parity code sent from the parity generating circuit 5, and hands the processed byte parity code to the ECC generating circuit 2. The ECC generating circuit 2 converts the byte parity code into the SECDED code and writes the SECDED code in the memory 3.

The ECC generating circuit 2 may have a structure illustrated in FIG. 2. In this case, the ECC generating circuit 2, based on the information portion v of the byte parity code, generates the lower d bits $(c_m, \ldots, c_{k-1})$ of the redundant portion of the SECDED code by using the XOR circuits $12_m, \ldots, 12_{k-1}$. Then, the ECC generating circuit 2, based on the lower d bits $(c_m, \ldots, c_{k-1})$ of the redundant portion of the SECDED code and the parity bits $(p_0, \ldots, p_{m-1})$ of the byte parity code, generates the upper m bits $(c_1, \ldots, c_{m-1})$ of the redundant portion of the SECDED code by using the XOR circuits $13_0, \ldots, 13_{m-1}$. Then, the ECC generating circuit 2 attaches the lower d bits and the upper m bits of the redundant portion of the SECDED code to the information portion of the byte parity code, thereby obtaining the SECDED code. The ECC generating circuit 2 then writes the SECDED code in the memory 3.

Figure 12:
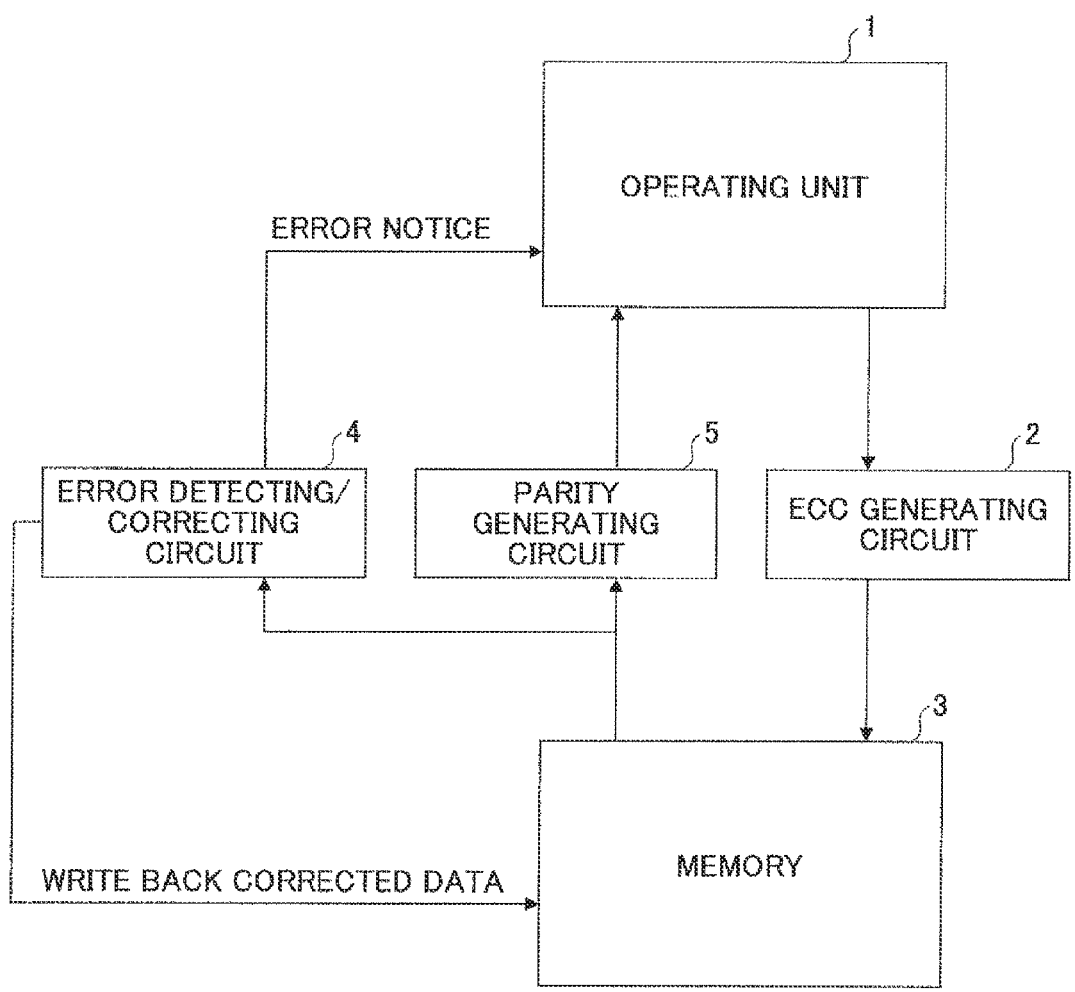
FIG. 12 is a block diagram of the data operating unit according to another embodiment of the present invention.

FIG. 12 is a block diagram of a second example of the data operating unit. The data operating unit according to the second example is configured to give priority to the speed at which the operating unit 1 reads data from the memory 3.

The data operating unit of the second example illustrated in FIG. 12 includes an operating unit 1, an ECC generating circuit 2, a memory 3, an error detecting/correcting circuit 4, and a parity generating circuit 5. The ECC generating circuit 2, the memory 3, the error detecting/correcting circuit 4, and the parity generating circuit 5 are similar to the corresponding units or circuits of the data operating unit illustrated in FIG. 11 in structure and function.

The memory 3 stores data of the SECDED code format. The operating unit 1 reads the data from the memory 3 and sends the data to the parity generating circuit 5. The parity generating circuit 5 converts the SECDED code into the byte parity code by the method described with reference to FIG. 11, and delivers the byte parity code to the operating unit 1. The data read from the memory 3 is also simultaneously sent to the error detecting/correcting circuit 4. The error detecting/correcting circuit 4 performs an error detecting/correcting process on the data, i.e., the SECDED code, and notifies the operating unit 1 about a result of the process. The error detecting/correcting circuit 4, when correcting a bit error in the information portion of the SECDED code, may overwrite a corrected bit in the memory 3.

The operating unit 1, based on the result of the error detecting/correcting process obtained from the error detecting/correcting circuit 4, may perform error correction on the byte parity code sent from the parity generating circuit 5, as needed. The operating unit 1 performs an operating process on the byte parity code. After the operating process, the operating unit 1 sends the byte parity code to the ECC generating circuit 2. The ECC generating circuit 2 converts the byte parity code into the SECDED code by the method described with reference to FIG. 11, and writes the SECDED code in the memory 3.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that the various changes, substitutions, and alterations could be made hereto without departing from the spirit and scope of the invention.

What is claimed is:

1. An error detecting/correcting code generating circuit comprising:
   a first Exclusive-OR operation circuit that generates $\log_2(n+1)$ bits of one portion of a redundant portion of error detecting/correcting-code-attached data by rounding the numbers to the right of the decimal point of $\log_2(n+1)$ in response to the input of m bytes of an information portion included in error-detection-bit-attached data, the error-detection-bit-attached data including a redundant portion of m bits of error detection bits allocated to the m bytes of the information portion, the byte having n bits; and
   a second Exclusive-OR operation circuit that generates m bits of another portion of the redundant portion of the error detecting/correcting-code-attached data in response to the input of the one portion and the error detection bits.

2. The error detecting/correcting code generating circuit according to claim 1, wherein,
   when each of the bytes of the information portion of the error-detection-bit-attached data is expressed by a byte vector having n elements, and the information portion of the error-detection-bit-attached data is expressed by an information vector having m elements, the first Exclusive-OR operation unit generates the one portion in response to the input of a value of the information vector, and the second Exclusive-OR operation unit generates the other portion in response to the input of the one portion and the error detecting bits, in accordance with an error detecting/correcting code generating formula for generating a vector of the one portion and a vector of the other portion by a matrix operation of the information vector and the error detection bits.

3. The error detecting/correcting code generating circuit according to claim 1, wherein the error detecting/correcting-code-attached data has $(n+1)m+[\log_2(n+1)]$ bits of which the mn bits constitute the information portion and of which the other $m+[\log_2(n+1)]$ bits constitute the redundant portion, where $[\log_2(n+1)]$ indicates $\log_2(n+1)$ from which the numbers to the right of the decimal point have been rounded, the circuit further comprising:

a third Exclusive-OR operating circuit that generates the error detection bits in response to the input of a maximum of $[\log_2(n+1)]$ bits of the redundant portion.

4. The error detecting/correcting code generating circuit according to claim 2, wherein, when each of the bytes of the information portion of the error-detection-bit-attached data is expressed by a byte vector $v_i(v_{i(0)}, v_{i(1)}, \ldots, v_{i(n-2)}, v_{i(n-1)})$ having n elements, the information portion of the error-detection-bit-attached data is expressed by an information vector $v(v_0, v_1, \ldots, v_{m-1})$ having m elements, the redundant portion of the error-detection-bit-attached data is expressed by m bits of error detection bits $p(p_0, p_1, \ldots, p_{m-2}, p_{m-1})$ allocated to each element of the information vector having the m elements, and the error-detection-bit-attached data is expressed by a byte parity code $vp(v, p)$, the first Exclusive-OR operation unit generates a value of a d-order vector $c_2$ which is the one portion of the redundant portion of the error detecting/correcting-code-attached data, and the second Exclusive-OR operation unit generates a value of an m-order vector $c_1$ which is the other portion of the redundant portion of the error detecting/correcting-code-attached data, in response to the input of a value of the information vector $v(v_0, v_1, \ldots, v_{m-1})$ and a value of the error detection bits $p(p_0, p_1, \ldots, p_{m-2}, p_{m-1})$ of the byte parity code $vp(v,p)$, and in accordance with the error detecting/correcting code generating formula which is expressed by the following:

$$\begin{pmatrix} c_1^t \\ c_2^t \end{pmatrix} = \begin{pmatrix} p^t + C \cdot c_2^t \\ B \cdot v_0^t + B \cdot v_1^t + \ldots + B \cdot v_{m-1}^t \end{pmatrix}$$

wherein each bit $p_i$ of the error detection bits $p(p_0, p_1, \ldots, p_{m-2}, p_{m-1})$ and the byte vector $v_i(v_{i(0)}, v_{i(1)}, \ldots, v_{i(n-2)}, v_{i(n-1)})$ of each element of the information vector $v(v_0, v_1, \ldots, v_{m-1})$ have the following relationship:

$$p_i = v_{i(0)} + v_{i(1)} + \ldots + v_{i(n-2)} + v_{i(n-1)}$$

where "+" indicates an Exclusive-OR operation and "t" indicates a transposition of a matrix.

5. An error detection bit generating circuit in which error detecting/correcting-code-attached data has $(n+1)m+[\log_2(n+1)]$ bits including mn bits of an information portion and a redundant portion, the redundant portion including one portion of $[\log_2(n+1)]$ bits and another portion of m bits, $[\log_2(n+1)]$ indicating $\log_2(n+1)$ from which the numbers to the right of the decimal point have been rounded, the circuit comprising:

an Exclusive-OR operation circuit that generates an error detection bit in response to the input of the data having a maximum of $[\log_2(n+1)]$ bits of the redundant portion.

6. A method of controlling an error detecting/correcting code generating circuit, the method comprising:

generating one portion of $\log_2(n+1)$ bits of a redundant portion of error detecting/correcting-code-attached data by rounding the numbers to the right of the decimal point of $\log_2(n+1)$ in response to the input of m bytes of an information portion included in error-detection-bit-attached data, using a first Exclusive-OR operation circuit of the error detecting/correcting code generating circuit, the error-detection-bit-attached data further including a redundant portion of m bits of error detection bits allocated to the m bytes of the information portion, each of the bytes having n bits; and generating another portion of m bits of the redundant portion of the error detecting-code-attached data in response to the input of the $\log_2(n+1)$ bits of the one portion and the error detection bits, using a second Exclusive-OR operation circuit of the error detecting/correcting code generating circuit.

7. The method of controlling the error detecting/correcting code generating circuit according to claim 6, wherein when each of the bytes of the information portion of the error-detection-bit-attached data is expressed by a byte vector having n elements, and the information portion of the error-detection-bit-attached data is expressed by an information vector having m elements, the generating of the one portion of $\log_2(n+1)$ bits includes generating the one portion in response to the input of the information vector in accordance with an error detecting/correcting code generating formula, and the generating of the m bits of the other portion includes generating the other portion in response to the input of the one portion and the error detection bits in accordance with the error detecting/correcting code generating formula, wherein the error detecting/correcting code generating formula generates a vector of the one portion and a vector of the other portion by a matrix operation of the information vector and the error detection bits.

8. The method of controlling the error detecting/correcting code generating circuit according to claim 6, wherein the error detecting/correcting-code-attached data has $(n+1)m+[\log_2(n+1)]$ bits of which the mn bits constitute the information portion and of which the other $m+[\log_2(n+1)]$ bits constitute the redundant portion, $[\log_2(n+1)]$ indicating $\log_2(n+1)$ from which the numbers to the right of the decimal point have been rounded, the method further comprising:

generating each of the error detection bits in response to the input of a maximum of $[\log_2(n+1)]$ bits of the redundant portion, using a third Exclusive-OR operation circuit of the error detecting/correcting code generating circuit.

9. The method of controlling the error detecting/correcting code generating circuit according to claim 7, wherein
when each of the bytes of the information portion of the error-detection-bit-attached data is expressed by a byte vector $v_i(v_{i(0)}, v_{i(1)}, \ldots, v_{i(n-2)}, v_{i(n-1)})$ having n elements,
the information portion of the error-detection-bit-attached data is expressed by an information vector $v(v_0, v_1, \ldots, v_{m-1})$ having m elements,
the redundant portion of the error-detection-bit-attached data is expressed by m bits of an error detection bit $p(p_0, p_1, \ldots, p_{m-2}, p_{m-1})$ allocated to each element of the information vector having the m elements, and the error-detection-bit-attached data is expressed by a byte parity code vp(v,p),
the generating of the one portion of $\log_2(n+1)$ bits includes generating a d-order vector $c_2$ of the one portion of the redundant portion of the error detecting/correcting-code-attached data, and
the generating of the m bits of the other portion includes generating an m-order vector $c_1$ of the other portion of the redundant portion of the error detecting/correcting-code-attached data,
in response to the input of the information vector $v(v_0, v_1, \ldots, v_{m-1})$ and the error detection bit $p(p_0, p_1, \ldots, p_{m-2}, p_{m-1})$ of the byte parity code vp(v,p), and
in accordance with the error detecting/correcting code generating formula expressed by the following:

$$\begin{pmatrix} c_1^t \\ c_2^t \end{pmatrix} = \begin{pmatrix} p^t + C \cdot c_2^t \\ B \cdot v_0^t + B \cdot v_1^t + \ldots + B \cdot v_{m-1}^t \end{pmatrix}$$

wherein each bit $p_i$ of the error detection bit $p(p_0, p_1, \ldots, p_{m-2}, p_{m-1})$ and the byte vector $v_i(v_{i(0)}, v_{i(1)}, \ldots, v_{i(n-2)}, v_{i(n-1)})$ of each element of the information vector $v(v_0, v_1, \ldots, v_{m-1})$ have the following relationship:

$p_i = v_{i(0)} + v_{i(1)} + \ldots + v_{i(n-2)} + v_{i(n-1)}$ where "+" indicates an Exclusive-OR operation and "t" indicates a transposition of a matrix.

* * * * *